(12) United States Patent
Velazquez et al.

(10) Patent No.: US 10,911,029 B1
(45) Date of Patent: Feb. 2, 2021

(54) MULTI-DIMENSIONAL COMPENSATOR

(71) Applicant: Innovation Digital, LLC, San Diego, CA (US)

(72) Inventors: Scott R. Velazquez, San Diego, CA (US); Yujia Wang, San Diego, CA (US)

(73) Assignee: Innovation Digital, LLC, San Diego, CA (US)

( * ) Notice: Subject to any disclaimer, the term of this patent is extended or adjusted under 35 U.S.C. 154(b) by 0 days.

(21) Appl. No.: 16/293,089

(22) Filed: Mar. 5, 2019

Related U.S. Application Data

(63) Continuation-in-part of application No. 15/807,419, filed on Nov. 8, 2017, now abandoned.

(51) Int. Cl.
  *H03H 21/00* (2006.01)
  *H03H 17/02* (2006.01)
  *H03F 1/32* (2006.01)
  *H03M 1/06* (2006.01)
  *H03F 3/24* (2006.01)

(52) U.S. Cl.
  CPC ....... *H03H 21/0067* (2013.01); *H03F 1/3247* (2013.01); *H03F 3/24* (2013.01); *H03H 17/0261* (2013.01); *H03M 1/0612* (2013.01); *H03F 2200/451* (2013.01)

(58) Field of Classification Search
  CPC ........ H03F 1/3241; H03F 1/3247; H03F 3/24; H03F 2200/451; H04B 2001/0425; H03H 21/0067; H03H 17/0261; H03M 1/0612
  See application file for complete search history.

(56) References Cited

U.S. PATENT DOCUMENTS

| | | | |
|---|---|---|---|
| 6,449,110 B1 | 9/2002 | DeGroat et al. | |
| 6,587,514 B1 * | 7/2003 | Wright | H03F 1/3241 330/149 |
| 7,012,772 B1 | 3/2006 | Vis | |

(Continued)

*Primary Examiner* — Sung S Ahn
(74) *Attorney, Agent, or Firm* — Insigne LLP

(57) ABSTRACT

The present invention is a computationally-efficient compensator for removing nonlinear distortion. The compensator operates in a digital post-compensation configuration for linearization of devices or systems such as analog-to-digital converters and RF receiver electronics. The compensator also operates in a digital pre-compensation configuration for linearization of devices or systems such as digital-to-analog converters, RF power amplifiers, and RF transmitter electronics. The multi-dimensional compensator effectively removes linear and nonlinear distortion in these systems by accurately modeling the state of the device by tracking multiple functions of the input, including but not limited to present signal value, delay function, derivative function (including higher order derivatives), integral function (including higher order integrals), signal statistics (mean, median, standard deviation, variance), covariance function, power calculation function (RMS or peak), or polynomial functions. The multi-dimensional compensator can be adaptively calibrated using simple arithmetic operations that can be completed with low processing requirements and quickly to track parameters that rapidly change over time, temperature, power level such as in frequency-hopping systems.

25 Claims, 33 Drawing Sheets

(56) References Cited

U.S. PATENT DOCUMENTS

| | | |
|---|---|---|
| 7,123,659 B2 | 10/2006 | Orihashi et al. |
| 7,782,235 B1 | 8/2010 | Velazquez |
| 7,940,198 B1 | 5/2011 | Velazquez |
| 8,164,496 B2 | 4/2012 | Velazquez |
| 8,582,694 B2 | 11/2013 | Velazquez et al. |
| 9,705,477 B2 | 7/2017 | Velazquez |

* cited by examiner

MULTI-DIMENSIONAL COMPENSATOR

CROSS-REFERENCE TO RELATED APPLICATION

The present application claims priority to and is a continuation-in-part of U.S. patent application Ser. No. 15/807,419, entitled "Adaptive Volterra Compensator," filed on Nov. 8, 2017, the entire disclosure of which is incorporated by reference herein.

BACKGROUND OF THE INVENTION

1. Field of Invention

The present invention relates to electronics and more specifically, to techniques for reducing the distortion of electrical components such as analog-to-digital converters, digital-to-analog converters, radio frequency (RF) mixers, low-noise amplifiers (LNAs), and power amplifiers in RF transceiver systems.

2. Description of Related Art

Many techniques have been developed to model various linear and nonlinear distortion mechanisms in electronic devices with the goal of reducing distortion with minimal signal processing size, weight, and power requirements. Some techniques such as polynomial nonlinear models, nonlinear filters (such as Volterra filters or generalized memory polynomials) may be accurate and effective methods, but they require processing requirements for their calibration and operation, which may be demanding in certain implementations. For example, U.S. Pat. No. 9,705,477, the entire disclosure of which is incorporated by reference herein, provides a compensator for removing nonlinear distortion utilizing factored Volterra compensators, which may include a second-order factored Volterra compensator, a third-order factored Volterra compensator, and additional higher-order factored Volterra compensators.

In addition, methods for adaptive background calibration of these techniques have been developed, but they also require significant processing requirements and are slow to converge, which limits the effectiveness in applications with rapidly changing environments, such as frequency-hopping systems. Other techniques such as static memory tables are small and low-power but do not provide effective performance over frequency, time, temperature, power level, or other changing parameters.

Accordingly, a need exists to effectively model distortion mechanisms in electrical devices within minimal processing resources for both calibration and operation.

SUMMARY OF THE INVENTION

The present invention overcomes these and other deficiencies of the prior art by providing an effective technique to model linear and nonlinear distortion mechanisms while consuming minimal processing resources for both calibration and operation. Unlike, the prior art, the present invention, which is referred to as a multi-dimensional compensator, accurately models distortion by using a multitude of functions of the input signal to track distortion mechanisms that vary over frequency, time, temperature, power level, and other parameters. The functions of the input are used to very accurately model the various changing states of the device. For example, the functions include the present signal value, delay function, derivative function (including higher order derivatives), integral function (including higher order integrals), signal statistics (mean, median, standard deviation, variance), covariance function, power calculation function (RMS or peak), polynomial functions, and any combination thereof. These functions can be implemented in digital signal processing (DSP) with minimal resources (including without the use of multipliers or filters, which can be large and consume a large amount of power). These functions are used to index a memory to store correction values based on the current state of the device. Alternatively, a function such as a memoryless polynomial equation can be used instead of a memory to reduce the size of an implementation of the multi-dimensional compensator.

Furthermore, the correction values in the multi-dimensional compensator can be adaptively updated with simple arithmetic like averaging of error signals as opposed to complicated gradient descent, recursive least squares, or other similar adaptive algorithms. This allows for very fast updates to the DSP to track parameters that quickly change, such as frequency-hopping applications using very minimal processing requirements. Updates do not require complicated matrix inversions or covariance matrix evaluations.

The multi-dimensional compensator can readily be applied to systems using real-valued signals (such as direct RF-sampled systems) or complex-valued signals (such as complex baseband processing systems). For time-interleaved or frequency-division multiplexed or sub-ranged systems, separate multi-dimensional compensators can be effectively applied to each time or frequency slice or amplitude range to better model the distortion mechanisms.

When used in combination with other effective compensation techniques (such as Volterra filtering), the multi-dimensional compensator can significantly outperform those techniques on their own and can significantly reduce the processing requirements for those techniques on their own.

In an embodiment of the invention, a multi-dimensional compensator comprises: a correction calculator having a plurality of multi-dimensional inputs and an output, wherein one of the multi-dimensional inputs is coupled to an input signal, the correction calculator further comprising correction parameters; a first circuit applies a first function to the input signal to create a first function signal, wherein the first function signal is coupled to a second one of the multi-dimensional inputs of the correction calculator; and wherein the output of the correction calculator produces a correction signal compensating for distortion introduced by an electronic component. The first function is selected from the group of: delay function, a derivative, a derivative of order N where N is greater than one, an integral, an integral of order M where M is greater than one, a signal statistic, covariance, a power calculation function, a polynomial, and a combination thereof. The correction parameters are predetermined according to a one-time calibration of the electronic component or updated periodically according to an adaptive calibration of the electronic component. The correction calculator is implemented in memory. The input signal and first function signal are quantized values and optionally created according to non-uniform quantization. The correction calculator calculates a correction value using a calculator function selected from the group consisting of an equation, a spline, a finite-impulse response filter, and a combination thereof. The first circuit comprises a finite-impulse response filter, or an average of a forward first difference and a backward first difference, or an interpolator and an average of a forward first difference and a backward first difference. The input signal can comprise complex numbers. The correction signal can be fed into an input of the electronic component. Alternatively, the correction signal can be added to an output of the electronic component. The correction parameters can account for frequency-dependent group delay introduced by the electronic component. The correction parameters can be calculated from one or more single-tone and multi-tone signals injected into the electronic component, using MINIMAX optimization, using a buffer of digitized samples of an output signal of the electronic component, or based on a predetermined modulation type. The input signal can comprise a time-interleaved signal, a frequency-division multiplexed signal, a most significant bit (MSB) signal, a least significant bit (LSB) signal, or an interpolated signal. The multi-dimensional compensator can be used with a Volterra nonlinear filter. The multi-dimensional compensator may further comprise a second circuit applies a second function to the input signal to create a second function signal, wherein the second function signal is coupled to a third one of the multi-dimensional inputs of the correction calculator, wherein the first function and second function are different.

In another embodiment of the invention, a RF power amplifier comprises: a multi-dimensional compensator processing a digital input signal into a digital output signal, wherein the multi-dimensional compensator comprises correction parameters; a digital-to-analog converter converting the digital output signal into an analog output signal; and a RF power amplifier amplifying the analog output signal into a power amplifier output signal. The RF power amplifier can further comprise: an analog-to-digital converter converting the power amplifier output signal to a digital power amplifier output signal; and an adaptive calibration block processing the digital power amplifier output signal to update the correction parameters. The multi-dimensional compensator comprises a differentiator, a first index calculator, a second index calculator, and memory, wherein the differentiator is coupled to the second index calculator and not the first index calculator. A correction filter can be coupled between the multi-dimensional compensator and the digital-to-analog converter.

In yet another embodiment of the invention, a multi-dimensional compensator comprises: a demultiplexer processing an input signal into N parallel demultiplexed signals each at 1/Nth a data rate of the input signal, wherein is N is an integer equal to or greater than two; a first analog-to-digital converter (ADC) processing each one of the N parallel demultiplexed signals into a most significant bit (MSB) signal; a second ADC processing each one of the N parallel demultiplexed signals into a least significant bit (LSB) signal; for each MSB signal, a sub-ranged multi-dimensional compensator processing the respective MSB signal into a first output signal; for each LSB signal, a sub-ranged multi-dimensional compensator processing the respective LSB signal into a second output signal; for each first output signal and second output signal, a MSB/LSB combiner combining the respective first output signal and respective second output signal into a third output signal; and a multiplexer processing the respective third output signals into a compensator output signal. The sub-ranged multi-dimensional compensator comprises a differentiator, a first index calculator, a second index calculator, and memory.

The foregoing, and other features and advantages of the invention will be apparent from the following, more particular description of the preferred embodiments of the invention, the accompanying drawings, and the claims.

BRIEF DESCRIPTION OF THE DRAWINGS

For a more complete understanding of the present invention and advantages thereof, reference is now made to the ensuing descriptions taken in connection with the accompanying drawings briefly described as follows.

DETAILED DESCRIPTION OF EMBODIMENTS

Figure 1:
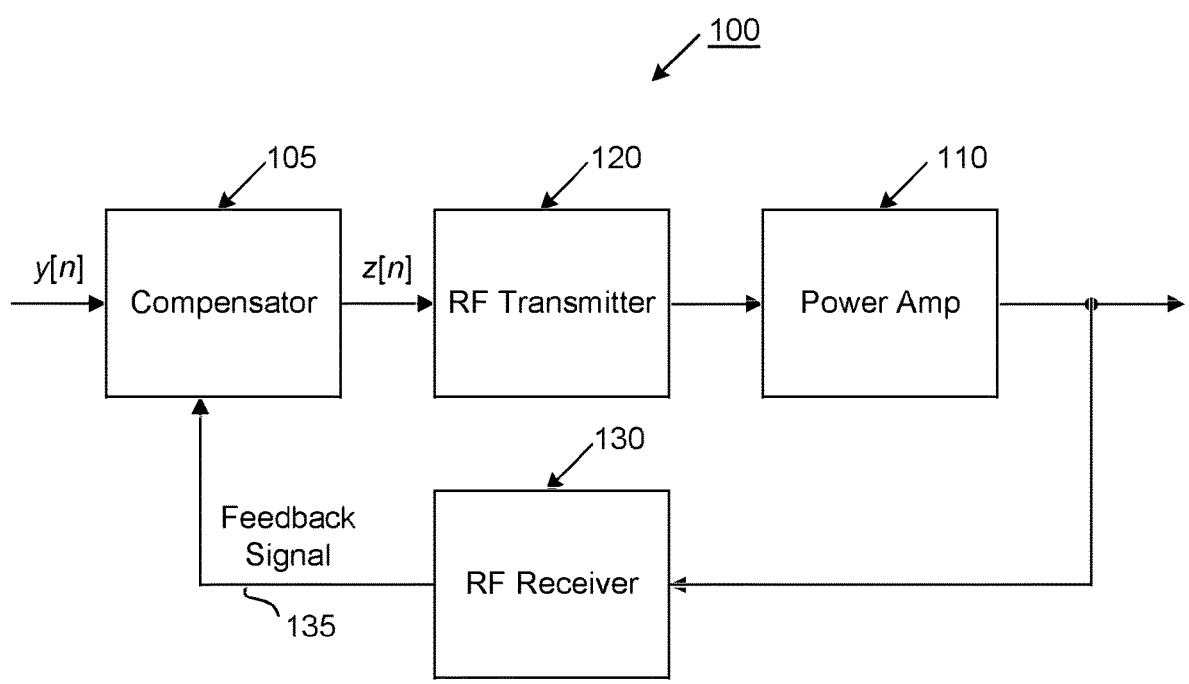
FIG. 1 illustrates an adaptive linearized power amplifier system.

Further features and advantages of the invention, as well as the structure and operation of various embodiments of the invention, are described in detail below with reference to the accompanying FIGS. 1-32, wherein like reference numerals refer to like elements. Although the invention is described in the context of power amplifiers and analog-to-digital converters, one of ordinary skill in the art readily appreciates that the techniques and embodiments described herein are applicable to any type of electronic component where it is desired to accurately and adequately eliminate inherent non-linear errors.

FIG. 1 illustrates a general adaptive linearized power amplifier system 100. The system 100 comprises a compensator 105, an RF transmitter 120, a power amplifier 110, and an RF receiver 130. The compensator 100 receives an uncompensated input signal y[n] and produces a compensated output signal z[n]. The RF transmitter 120 comprises a digital-to-analog converter and may optionally include RF upconversion electronics to convert a baseband signal to a higher RF. The power amplifier 110 amplifies the RF signal and introduces the undesired nonlinear distortion. The power amplifier 110 output is tapped and coupled to the RF receiver 130. The RF receiver 130 comprises an analog-to-digital converter and may optionally include RF downconversion electronics to convert the power amplifier output from RF to baseband. The feedback signal 135 is a digitized representation of the tapped power amplifier output, which is used by the compensator 105 to update its behavior, through an adaptive nonlinear distortion estimator 150, for optimal performance.

Figure 2:
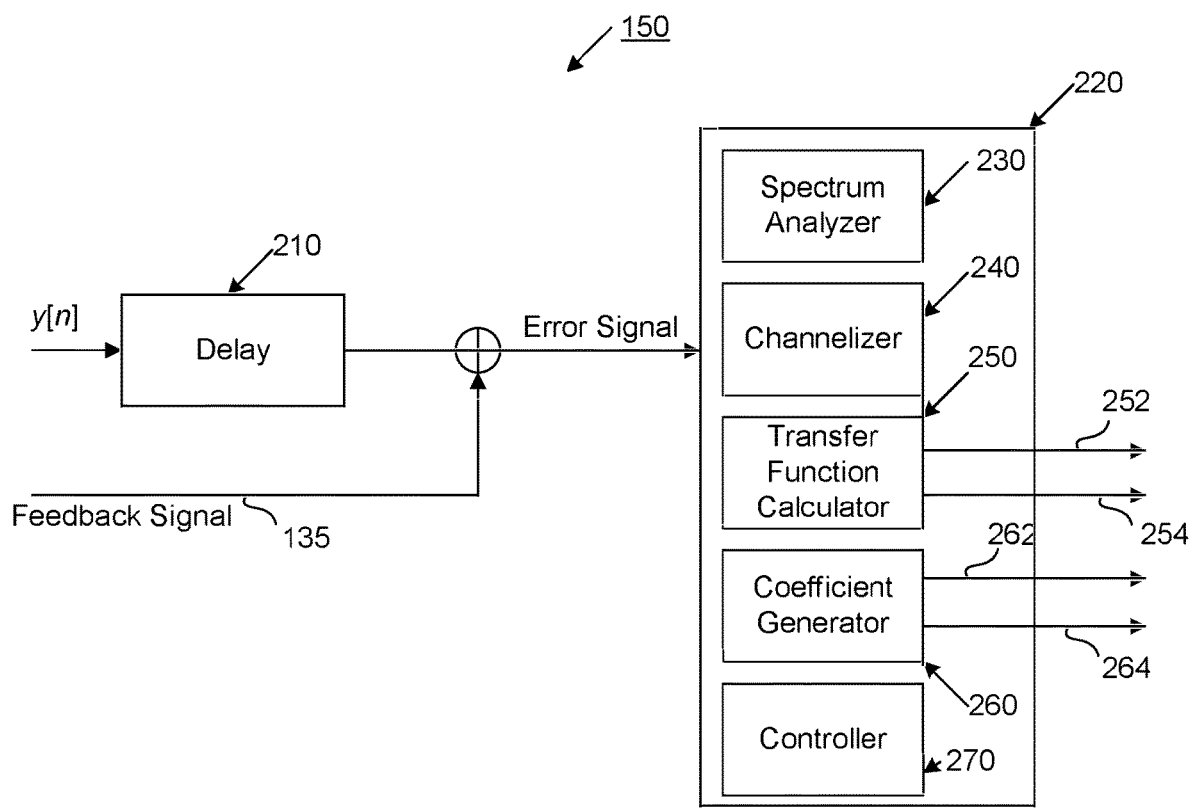
FIG. 2 illustrates the adaptive nonlinear distortion estimator of the compensator shown in FIG. 1.

FIG. 2 illustrates the adaptive nonlinear distortion estimator 150. The estimator 150 comprises a delay 210 and a parameter updater 220. The delay 210 delays the system input, y[n], so that it properly aligns with the feedback signal 135, which is a digitized representation of the power amplifier 210 output and is subject to delays incurred in the processing and circuitry of the system 100. The delayed input signal is combined with the feedback signal 135 via an adder to subtract out an error signal between the compensated output, z[n], and the uncompensated input, y[n]. The error signal is a representation of the difference between the uncompensated input signal, y[n], and the amplifier output, which includes the nonlinear distortion components that the compensator 105 corrects.

This error signal is introduced to the parameter updater 220. The parameter updater 220 comprises a spectrum analyzer 230, a channelizer 240, a transfer function calculator 250, a coefficient generator 260, and a controller 270, the implementation of all of which are apparent to one of ordinary skill in the art. Upon processing of the error signal, the transfer function calculator 250 outputs updated transfer function parameters 252. The coefficient generator 260 outputs updated filter coefficients 262. The spectrum analyzer 230 evaluates the spectral content of the error signal, for example, with a fast Fourier transformation (FFT) operation. The controller 270 uses this spectral content information to determine if the current signal is suitable for estimation of the nonlinear distortion components. For example, if the signal levels are currently too low for accurate estimation, then the controller will wait for a larger signal to appear before continuing with the estimation. The channelizer 240 partitions the error signal into frequency subbands, for example, with a digital filter bank, to analyze the distortion components over different frequencies.

The transfer function calculator 250 stores a table of the current distortion transfer function that maps the delayed input signal to the error signal, for example, in random access memory (RAM). The transfer function calculator 250 may also use a curve-fitting algorithm, the identification and implementation of which are apparent to one of ordinary skill in the art, to fit a polynomial equation to the transfer function. The calculator 250 outputs transfer function parameters 252, which may be this equation or the memory table. The calculator 250 optionally outputs similar transfer function parameters 254, which may be this equation or the memory table, for use in a heuristic compensation process described below. The coefficient generator 260 uses the output of the spectrum analyzer 230 to measure the relative gain and phase shift of the selected nonlinear distortion components. These gain and phase shift measurements are cataloged over frequency for different input signals. Standard digital filter design methods may be used to fit a digital filter to the gain and phase shift measurements to generate the filter coefficients 262. The generator 260 optionally outputs coefficients 264 for use in a heuristic compensation process described below.

Heuristic calibration is also implemented. Heuristic calibration maintains and updates the calibration history over numerous operating conditions, e.g., time, temperature, frequency, signal level, drift, etc. For example, distortion transfer functions are generated for various sets of operating conditions and are stored in a look-up table. In the event that operating conditions change, an applicable set of filters coefficients 262 can be updated periodically to maintain optimal performance in varying conditions over time.

Figure 3:
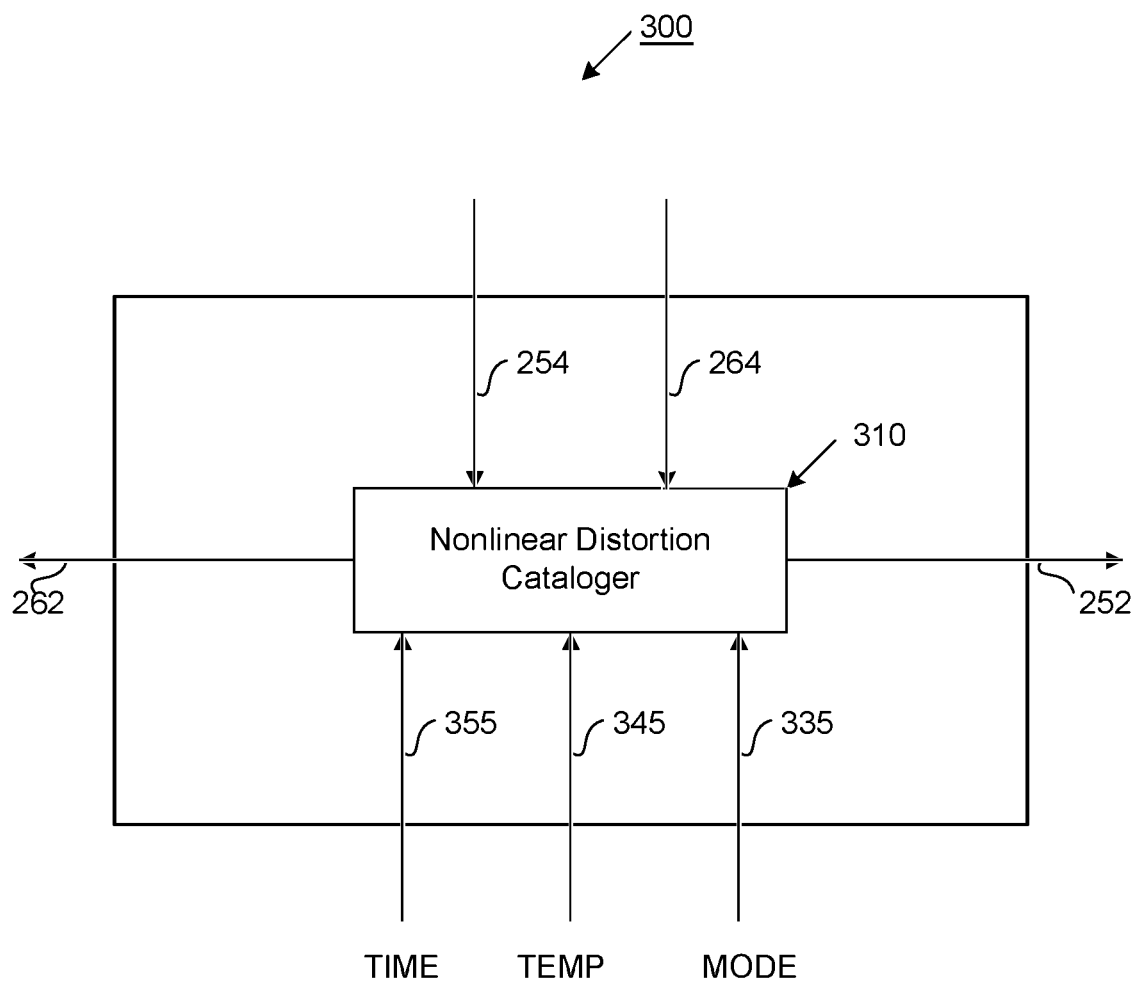
FIG. 3 illustrates a heuristic calibration system.

FIG. 3 illustrates a heuristic calibration system 300. Particularly, the heuristic calibration system 300 comprises a nonlinear distortion cataloger 310, which stores a history of various measurements, including, but not limited to transfer function parameters 254, filter coefficients 264, and other relevant parameters such as mode of operation 335, temperature 345, and time 355. The nonlinear distortion cataloger 310 outputs distortion transfer function parameters 252 and updated filter coefficients 262 that are calculated heuristically based on the current operation conditions, such as time, temperature, and mode of operation. The nonlinear distortion cataloger 310 can record a number of different measurements to allow for accurate interpolation or extrapolation of the transfer function parameters 252 and updated filter coefficients 262, given the RF system's current operating mode, current temperature, other current conditions, and over a range of frequencies. This record of different measurements can be stored in a catalog (not shown). The nonlinear distortion cataloger 310 can extract the most relevant measurements from the catalog in response to the current operating conditions of the system.

For example, the nonlinear distortion cataloger 310 can extract all of the nonlinear distortion level measurements that have been stored in the catalog that are for the current operating mode 335, within 5 degrees Celsius of the current temperature 345, with the last 30 seconds of the current time 355, and over all the frequencies at which measurements have been stored in the mismatch catalog. Repeated measurements at the same frequency can be averaged for a more accurate estimation. Missing measurements for particular frequencies can be interpolated or extrapolated from the extracted measurements. Measurements that vary significantly from previously stored measurements can be discarded since they may indicate a measurement glitch. This process performed by the nonlinear distortion cataloger 310 of extracting the relevant data from the catalog, combining repeated measurements, interpolating or extrapolating missing measurements, and discarding inaccurate measurements is a heuristic process that generates the transfer function parameters 252 and updated filter coefficients 262.

Figure 4:
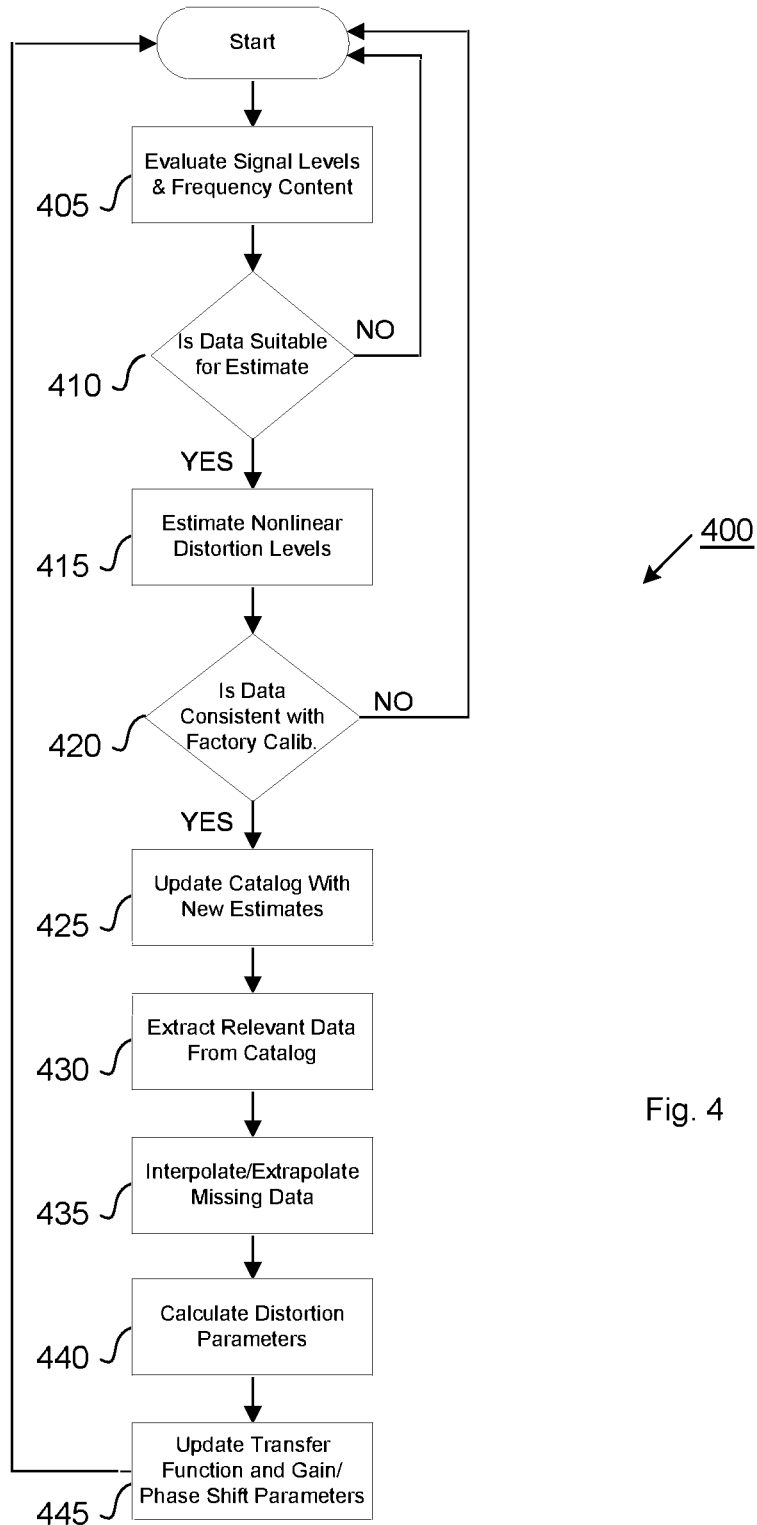
FIG. 4 illustrates a process for heuristically compensating nonlinear distortion.

FIG. 4 illustrates a process 400 for heuristically compensating nonlinear distortion. This process 400 is controlled by the nonlinear distortion cataloger 310 as shown in FIG. 3. The nonlinear distortion cataloger 310 can be implemented as a microprocessor or an embedded processor with a field programmable gate array (FPGA). Particularly, the process 400 begins by evaluating (step 405) the amplitudes and frequency content of the nonlinear distortion levels and determining (step 410) if that data is suitable for accurate estimation of the nonlinear distortion. The accuracy of the estimation can be degraded, for example, if the signal levels are very low (for example, less than −20 dBFS); therefore, for the most accurate estimation, the process can continually monitor the incoming signal until its amplitude is above a predetermined threshold. The single amplitude and frequency content can be measured, in one embodiment, with a FFT analysis of the input signals. A 512-point FFT can be performed with a microprocessor or embedded processor, and the magnitude of each FFT bin can be measured to determine the signal amplitude at various frequencies.

If the signal amplitude and frequency content is suitable, then the nonlinear distortion levels can be estimated (step 415). Optionally, the current estimations can be compared (step 420) to the factory calibration values stored in the catalog to ensure that the current estimations are not significantly different. A significant difference can indicate a component failure, a signal glitch, or other anomaly, whereby a determination can be made that the current estimation is not valid. If the current estimation is determined to be valid, then the new estimates are stored (step 425) in the catalog.

Based on the current operating conditions, such as current operating mode 335, temperature 345, and time 355, the catalog is searched and any relevant measurements are extracted (step 430), such as measurements near the current system temperature or having the same operating mode. If any pertinent measurements are missing from the catalog, they can be interpolated or extrapolated (step 435). For example, the catalog may contain estimates at a few different frequencies, but the values at the remaining frequencies can be interpolated or extrapolated using, in at least one embodiment of the invention, spline data fitting algorithms. Based on the interpolated/extrapolated data, the optimal nonlinear distortion parameters 252 and 262 can be calculated (step 440). The parameters are used to update (step 445) the amplitude and/or phase shift of the pre-distortion signal.

Referring back to FIG. 2, the controller 270 operates in the background to guide the processing of data with the spectrum analyzer 230, channelizer 240, transfer function calculator 250, coefficient generator 260, and nonlinear distortion cataloger 310. The controller 270 may be implemented with a digital signal processor or an embedded processor, for example, a field programmable gate array. A program instantiated in the controller 270 can implement the process 400 for heuristically compensating nonlinear distortion, as shown in FIG. 4.

The controller 270 may also implement an iterative optimization algorithm that repeatedly analyzes the error signal via the spectrum analyzer 230 to adjust the transfer function calculator 250 and the coefficient generator 260 for optimal performance. Standard iterative optimization algorithms, such as a binary search or Newton's Method may be used. For example, the filter coefficients 262 calculated by the coefficient generator 260 may be iteratively optimized to adjust the amplitude and/or phase shift of the pre-distortion signal such that the selected distortion components are nulled in the output.

In general, the power specification for an amplifier is chosen based on the type of signal to be transmitted (e.g., the peak-to-average signal level), the desired power output, and the desired dynamic range (e.g., third-order intercept point (IP3), 1 dB compression point). Conventional amplifiers are often backed off such that the peak power does not exceed the 1 dB compression point (typically, amplifiers are backed off even a few dB more to insure signals remain in the linear operating region). For example, a typical communications signal may have a peak-to-average ratio of 9 dB, so the amplifier may be backed off by approximately 12 dB below its 1 dB compression point to insure linear amplification. The present invention can be used to increase the 1 dB compression point by 3 to 6 dB, which allows the back-off to be reduced commensurately. This corresponds to reducing the necessary power rating for the amplifier by one-half to one-quarter, which significantly improves the amplifier efficiency (i.e., as the back-off decreases, the efficiency increases). Moreover, the present invention provides a 35 to 40 dB improvement to the spurious free dynamic range (SFDR). Conventional linearization techniques only provide a 10 dB improvement.

Standard, commercially-available field programmable gate array (FPGA) chips are capable of digital signal processing at approximately 400 MHz data rate. For data rates higher than 400 MHz, the processing can be transformed into simultaneous parallel channels, for example, using polyphase filtering structures. For example, 4 GHz data can be demultiplexed into 16 lower data rate (250 MHz each) channels for real-time parallel processing in a standard FPGA (providing an instantaneous bandwidth of 2 GHz).

Linearity compensation techniques are described in commonly-owned U.S. Pat. Nos. 6,198,416, and 7,782,235, the entire disclosures of which are all incorporated by reference herein.

The following describes additional layers of processing that can be added to the linearization techniques described above.

Figure 5:
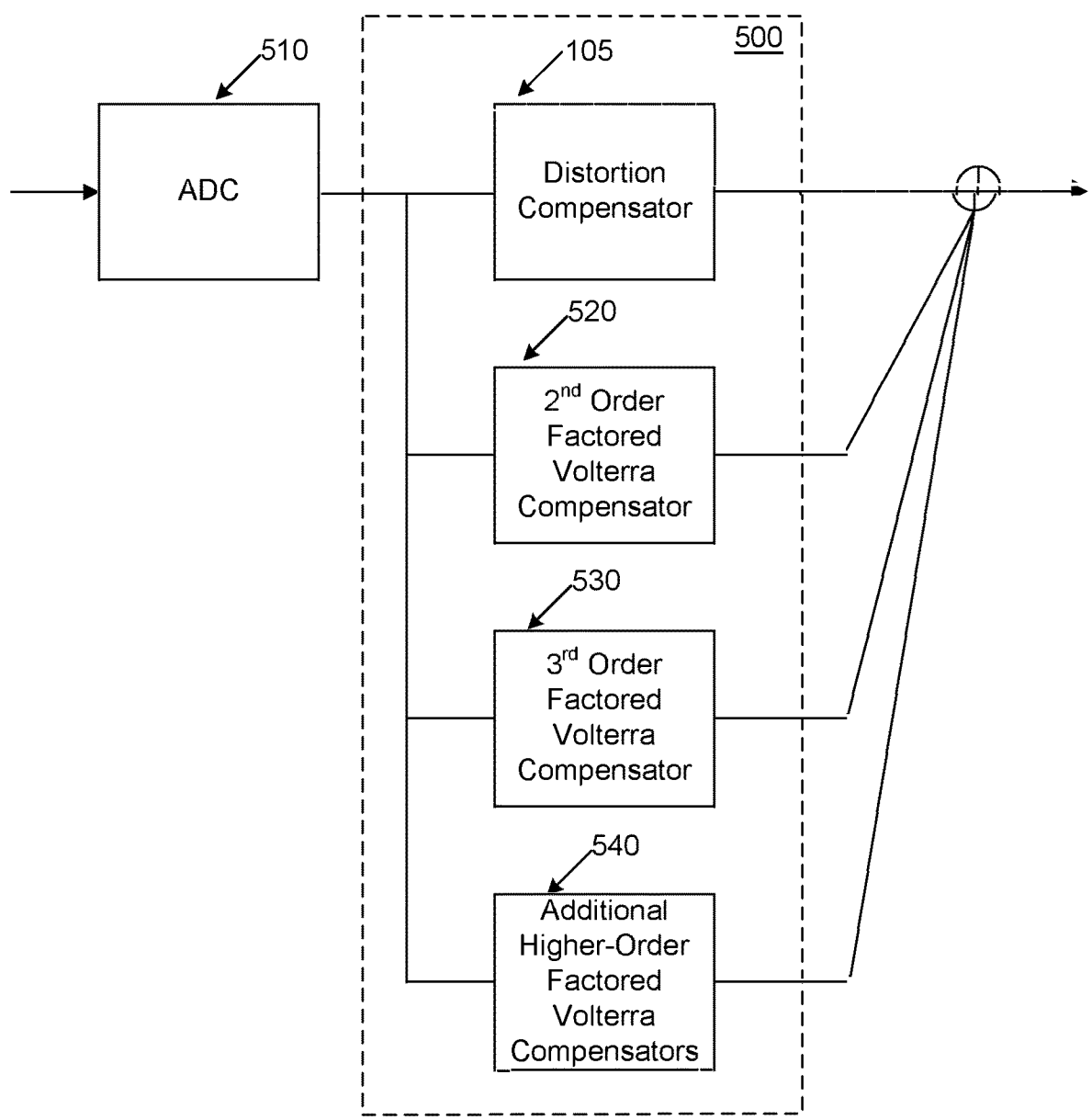
FIG. 5 illustrates a block diagram of a linearity compensator according to an embodiment of the invention.

FIG. 5 illustrates a block diagram of a linearity compensator 500. The linearity compensator 500 operates on an analog-to-digital converter (ADC) 510 and comprises the distortion compensator 105 and one or more factored Volterra compensators, which may include a second-order factored Volterra compensator 520, a third-order factored Volterra compensator 530, and additional higher-order factored Volterra compensators 540. Output of the ADC 510 is coupled to the inputs of the distortion compensator 105, the second-order factored Volterra compensator 520, the third-order factored Volterra compensator 530, and the additional higher-order factored Volterra compensators 540. The outputs of the distortion compensator 105, the second-order factored Volterra compensator 520, the third-order factored Volterra compensator 530, and the additional higher-order factored Volterra compensators 540 are coupled to an adder as shown. Volterra (or Volterra series) is a model for non-linear behavior where the output of the nonlinear system depends on the input to the system at theoretically all other times, thereby modeling intermodulation distortion of the system. Inclusion of the factored Volterra distortion compensators 520-540 improves linearization processing performance while significantly reducing the computational complexity compared to a traditional Volterra-based compensator without using the distortion compensator 105. In an embodiment of the invention, the factored Volterra distortion compensators 520-540 can be bypassed where only the distortion compensator 105 is implemented.

Figure 6:
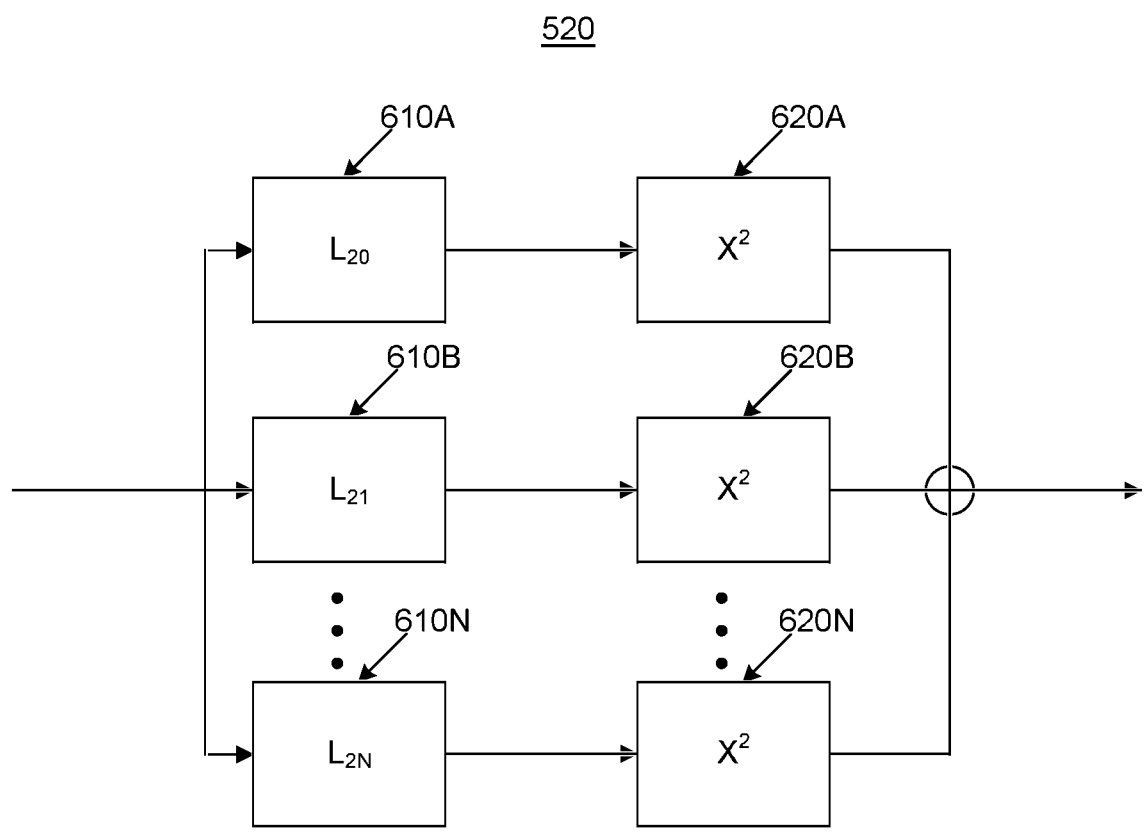
FIG. 6 illustrates the structure of the second-order factored Volterra compensator according to an embodiment of the invention.

FIG. 6 illustrates the structure of the second-order factored Volterra compensator 520. This second-order factored Volterra compensator 520 comprises a number, N, of linear filters 610A-N, each of which has a corresponding squaring function 620A-N. The outputs of the squaring functions 620A-N are added together to produce the compensation signal output of the second-order factored Volterra compensator 520. In an embodiment of the invention, filter 610A is a 4-tap FIR filter. Accordingly, N is equal to 4, i.e., there are four filters 610A-D. The N linear filters 610A-N correspond to the dominant factors of the Volterra series; the process of measuring and factoring the Volterra series is described below.

Figure 7:
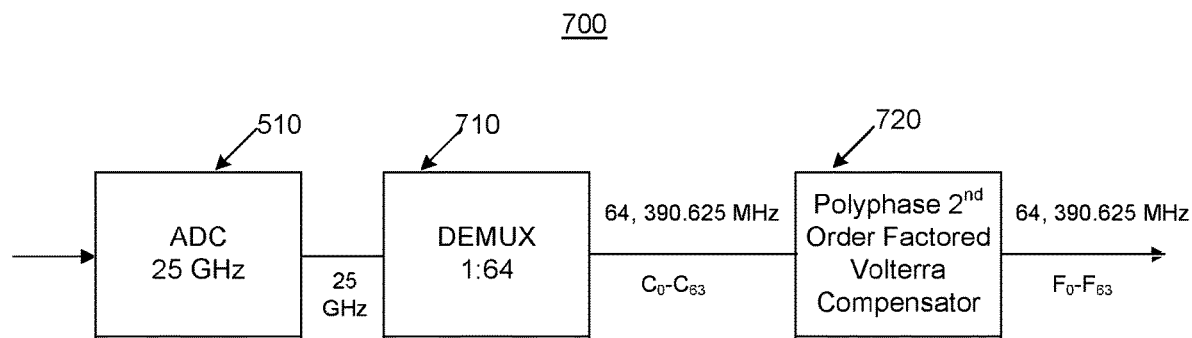
FIG. 7 illustrates the second-order factored Volterra compensator operating in a parallel polyphase configuration according to an exemplary embodiment of the invention.

FIG. 7 illustrates the second-order factored Volterra compensator operating in a parallel polyphase configuration 700. Here, the ADC 510 is operating at 25 GHz. A 1:64 demultiplexer 710 ("DEMUX") is coupled to the output of the ADC 510 and a polyphase second-order factored Volterra compensator 720. Accordingly, the polyphase second-order factored Volterra compensator 720 operates on 64 demultiplexed ADC output signals, referred in the figure as $C_0$-$C_{63}$ at a relatively low data rate of 390.625 MHz. The demultiplexed compensation signal outputs from the polyphase second-order factored Volterra compensator 720 are referred in the figure as $F_0$-$F_{63}$. Without this parallelization of the processing into numerous lower data rate paths, the extremely fast data rate would be beyond the capabilities of realizable hardware, such as digital signal processors (DSP), field programmable gate arrays (FPGA), or application specific integrated circuits (ASIC). Such parallelization may be implemented, for example, as polyphase finite impulse response (FIR) filters, the implementation of which is readily apparent to one of ordinary skill in the art. Likewise, a polyphase third-order factored Volterra compensator (not shown) operates on 64 demultiplexed ADC output signals, referred in the figure as $C_0$-$C_{63}$ at a data rate of 390.625 MHz.

Linear filter 610A-N implements factored Volterra kernels which are measured via harmonic probing. Harmonic probing is implemented by injecting known multi-tone test signals into the ADC input. In a preferred embodiment of the invention, the number of tones needed is greater than or equal to the order of the kernel (e.g., greater than or equal to 3-tones for a third-order kernel). The frequency of each test tone is selected to minimize (or eliminate) overlapping components, e.g., harmonics do not have the same frequency as the fundamental tone. Overlapping measurements can be discarded so that only non-overlapping measurements are employed. More tones can be used than required for fewer test signals (e.g., using 3-tone test signals to measure second- and third-order kernels), with the same constraints on overlapping components. Test frequencies are selected to be centered on FFT bins (e.g., prime-coherent sampling) and all combinations are chosen to cover the full N-dimensional frequency space (e.g., for 3-tone combinations, each tone covers the desired frequency range and are calculated, for example, with embedded for-loops for each tone). Symmetry of the Volterra kernels reduces the required number of tone combinations. The amplitude of the test signals is preferably set to near full scale, i.e., saturation, of the system where the distortion is most prominent.

In an alternative embodiment of the invention, test frequencies are selected randomly for uniform coverage over the N-dimensional frequency space. Test signals with too many overlapping components may be discarded. In order to prevent introduction of external non-linear distortion, high-linearity signal combiners are employed and the signal generator outputs' harmonic distortion is filtered via low-pass or band-pass filters.

A frequency domain Volterra kernel is analogous to a multi-dimensional linear filter where the input is $$X_n[k_1, k_2, \ldots, k_n] = X[k_1] * X[k_2] \ldots * X[k_n]$$

and the output is an n-dimensional convolution of input $$X_n(z_1, z_2, \ldots, z_n) = X_n(z_1) X_n(z_2) \ldots X_n(Z_n)$$

with n-dimensional Volterra kernel $H_n(z_1, z_2, \ldots, z_n)$. The one-dimensional output in the time domain is the diagonal of n-dimensional output $y_n(k_1, k_2, \ldots, k_n)$.

Since multi-tone sinusoidal inputs in time-domain correspond to dirac delta functions in frequency-domain, the frequency response of the Volterra kernel $H_n(z_1, z_2, \ldots z_n)$ is effectively sampled at the multi-tone frequencies by using multi-tone sinusoidal test signals. The complex frequency response of the one-dimensional output is calculated, for example, with a one-dimensional FFT and evaluated at the frequencies of the harmonics and intermodulation distortion components (i.e., the "sum" frequencies). Care must be taken to appropriately scale the amplitude of the complex frequency response if some of the frequencies in the multi-tone sinusoidal test signal are repeated. This process is repeated for multiple multi-tone sinusoidal such that the Volterra kernel $H_n(z_1, z_2, \ldots z_n)$ is cataloged for many frequencies over the desired bandwidth.

Figure 8:
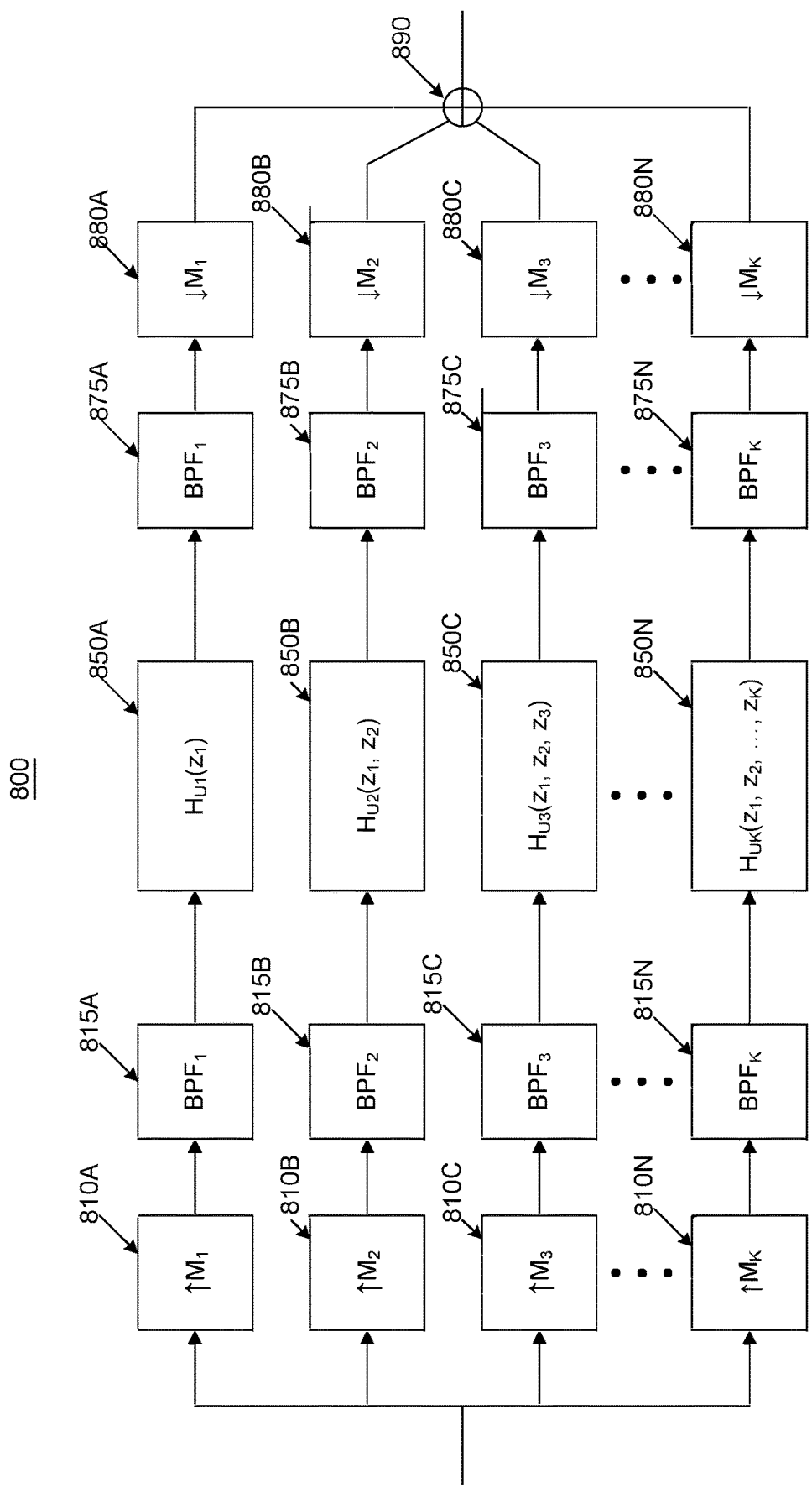
FIG. 8 illustrates a block diagram of a multi-rate Volterra compensator according to an embodiment of the invention.

FIG. 8 illustrates a multi-rate Volterra compensator 800 operated at a sample rate that is commensurate with the bandwidth of the nonlinear distortion that is being modeled. For example, if the maximum frequency in the desired band is $f_1$ and the maximum order of the compensator is 3, then the maximum frequency of the nonlinear distortion is the third harmonic at $3f_1$. Therefore, the factored Volterra compensator can be operated at a minimum sample rate of $6f_1$ to properly resolve the bandwidth of the modeled distortion components according to the Nyquist theorem. Bandpass interpolation is implemented using upsamplers 810A-N and bandpass filters 815A-N and can be used to appropriately increase the sample rate of the multirate Volterra compensator. Increasing the sample rate of the compensator has the effect of only utilizing particular subbands of the upsampled Volterra filters 850A-850N since nonlinear distortion components will not fall at all possible frequencies.

The upsampled Volterra filters 850A-850N can correspond to multi-dimensional upsampled Volterra kernels, where a non-upsampled Volterra filter is "zero-stuffed" by a factor of $M_k$ (i.e., $M_k$ zeroes are inserted between adjacent Volterra kernel coefficients in a multi-dimensional sense). This process is called multi-dimensional upsampling by those skilled in the art. In the frequency domain, the upsampled Volterra filter accurately approximates the desired frequency response in the active subbands, and this frequency response is simply repeated (with conjugate symmetry) in the inactive or "do not care" bands. Since only a subset of Volterra kernel coefficients are non-zero, this greatly simplifies the Volterra filter design algorithm (described below) and greatly reduces the size of the hardware implementation (since the many zero coefficients correspond to simple time delays instead of full multipliers).

For many applications, the bandwidth of the system is limited. Bandpass decimation is implemented with bandpass filters 875A-N and downsamplers 880A-N and may optionally be used to limit the bandwidth of the compensation signal and reduce the sample rate. This greatly reduces the processing resources required by significantly reducing the data rate.

Figure 9:
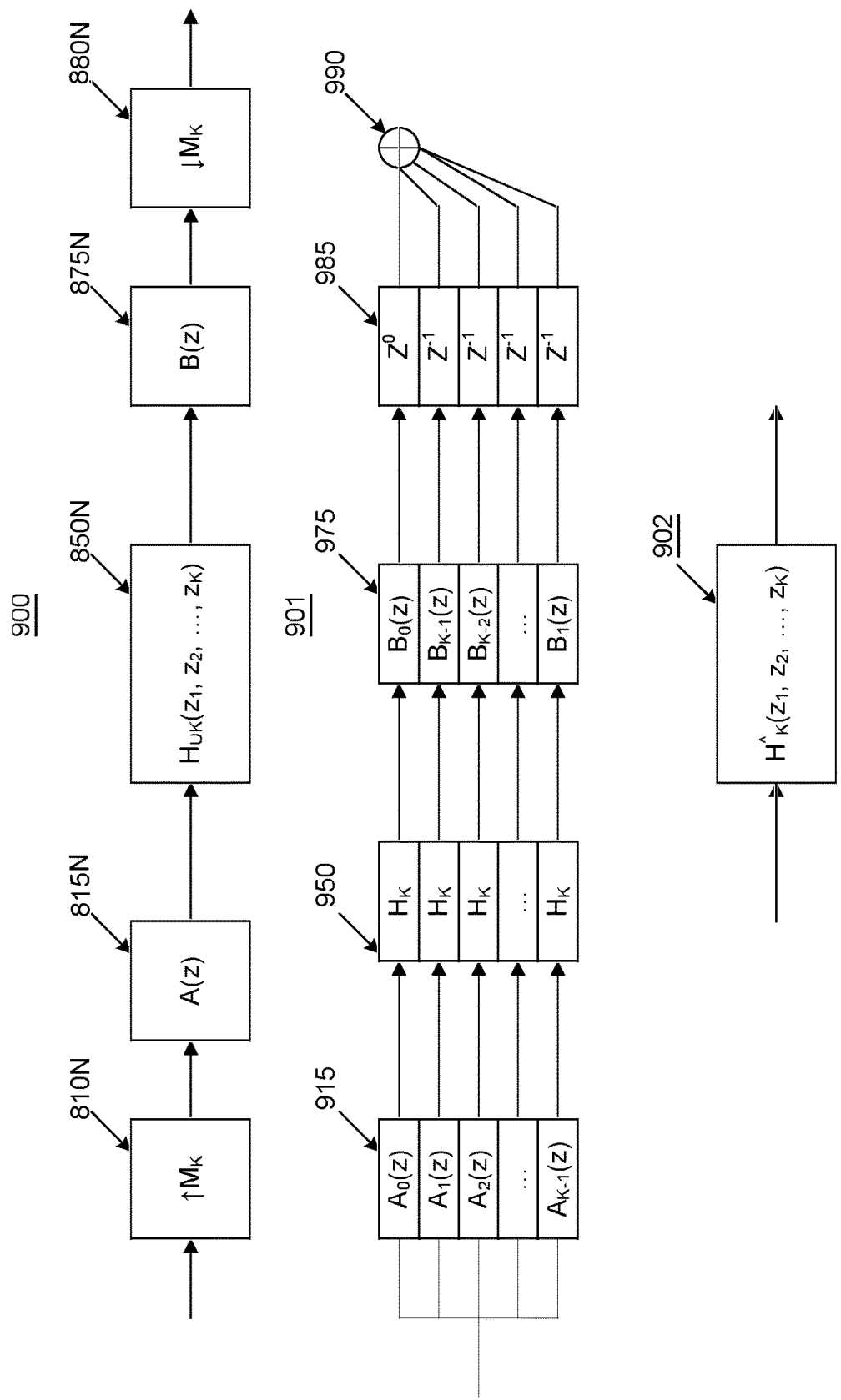
FIG. 9 illustrates a block diagram of a polyphase Volterra compensator and equivalent Volterra compensator according to embodiments of the invention.

FIG. 9 depicts the multi-rate Volterra compensator 800 implemented in an efficient polyphase Volterra configuration 901. A generalized version of the $k^{th}$ order processing arm shown in FIG. 8 including upsampler 810N, bandpass filter 815N, upsampled $k^{th}$ order Volterra filter 850N, bandpass filter 875N, and downsampler 880N is shown as 900 in FIG. 9. The processing arm 900 in FIG. 9 is more general than that of FIG. 8 since it optionally allows the bandpass filter A(z) 810N to be different than the bandpass filter B(z) 875N.

The polyphase Volterra filter 901 in FIG. 9 is used, which is mathematically equivalent to the $k^{th}$ order processing arm 900. The polyphase Volterra filter 901 includes polyphase bandpass filters 915, downsampled Volterra filters 950, polyphase bandpass filters 975, and delays 985 and a summer 990. The polyphase bandpass filters 915 and 975 are the $M_k$ polyphase components of the filters A(z) 810N and B(z) 880N respectively, which are readily determined by one skilled in the art. The downsampled Volterra filters 950 correspond to the non-zero kernel coefficients of the upsampled Volterra filter 850N; in other words, the Volterra filters 950 are multi-dimensionally downsampled by $M_k$ to remove the added zeros in the upsampled Volterra filters 850N. The polyphase Volterra filter 901 is significantly more efficient to implement in hardware than the processing arm 900 since it is processed at the lower (i.e., non-upsampled) data rate. This corresponds to a smaller, lower power, lower cost hardware implementation.

An equivalent Volterra filter $\overline{H}_k$ 902 may optionally be used. The cascade of each polyphase bandpass filter 915, downsampled Volterra filter 950, and polyphase bandpass filter 975 is mathematically equivalent to the multi-dimensional convolution of the tensor outer product of the polyphase bandpass filters 915, the downsampled Volterra filter 950, and a multi-dimensional diagonal matrix containing the coefficients of the polyphase bandpass filter 975. This property allows the polyphase Volterra filter 901 to be optionally implemented in a single, equivalent Volterra filter 902. This equivalent Volterra filter 902 can then be factored and simplified into a set of parallel FIR filters as described below for an efficient hardware implementation.

Figure 10:
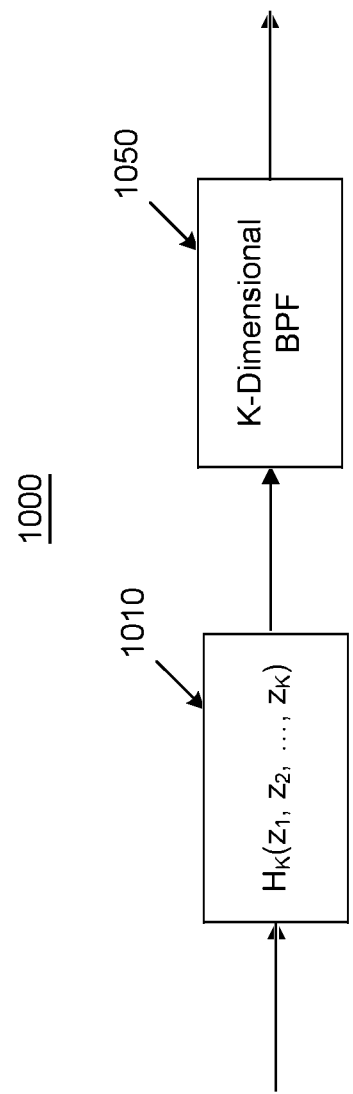
FIG. 10 illustrates a block diagram of a Volterra compensator with a K-dimensional bandpass filter according to an embodiment of the invention.

FIG. 10 illustrates an arbitrary Volterra filter 1010 is convolved with a multi-dimensional bandpass filter 1050 to attenuate high-frequency intermodulation distortion components that would otherwise exceed the Nyquist criterion and cause aliasing errors. The purpose of the multi-rate Volterra filtering techniques discussed above is to unambiguously resolve these super-Nyquist frequency components through bandpass interpolation, which effectively increases the sample rate such that the frequency of these components now satisfy the Nyquist criterion. However, the multi-dimensional Volterra filter has the ability to properly and unambiguously resolve the frequency response of these high frequency components itself without any sample rate increase since the extra dimensions of the filter have the necessary mathematical degrees of freedom. Without any sample rate increase, these super Nyquist components can otherwise cause aliasing. Aliasing of high frequency non-linear distortion is commonplace with devices such as analog-to-digital converters, so this is a very useful and efficient property of the Volterra filter in those cases.

However, for devices such as radio frequency power amplifiers, high frequency distortion components are not subject to aliasing since they are analog, continuous-time devices. In these cases, a multi-dimensional, preferably linear phase, bandpass filter 1050 is designed (using standard linear phase filter design techniques familiar to those skilled in the art) to attenuate the out-of-band distortion components and prevent aliasing errors. The multi-dimensional bandpass filter 1050 is convolved with the original Volterra filter 1010 to produce a new bandpass Volterra filter 1000 without aliasing errors. This allows the use of a small size original Volterra filter 1010, whose coefficients can be estimated more quickly and with less processing resources while accurately approximating the desired frequency response. Then this Volterra filter 1010 is augmented by multi-dimensional convolution with an appropriate multi-dimensional bandpass filter 1050 to prevent aliasing errors. This bandpass Volterra filter 1000 can then be factored and simplified into a set of parallel finite impulse response (FIR) filter as described below for an efficient hardware implementation.

Referring back to FIG. 8, upsamplers in 810A-N are not used. This oversampled compensator system is configured to operate on a bandlimited subband that is a portion of the full Nyquist bandwidth of the system and such that the high frequency distortion does not violate the Nyquist criterion and therefore no aliasing occurs. For example, a power amplifier pre-distortion linearization compensator is operated at a sample rate of 3 GHz but the desired band to compensated is only zero to 200 MHz and the highest order to be compensated is the fifth order. The highest frequency distortion components can appear at no greater than 1000 MHz, which is within the 1.5 GHz Nyquist zone of the system. Therefore, no upsampling is necessary since the system is already free of aliasing because it is oversampled.

In this alternative embodiment, the oversampled compensator system uses upsampled Volterra filters 850A-850N. As previously mentioned, since only a subset of Volterra kernel coefficients are non-zero, this greatly reduces the size of the hardware implementation since the many zero coefficients correspond to simple time delays instead of full multipliers. Furthermore, the bandpass decimators 880A-N may be implemented digitally or, alternatively, analog bandpass filters may be used to limit the bandwidth of the desired compensation signal.

The efficiency of the measurement of the Volterra kernels is greatly simplified due to the symmetry of the Volterra kernels, $h_n[k_1, k_2, \ldots k_n]$. The kernels $h_n[k_1, k_2, \ldots k_n]$ are equal for all permutations of $k_1, k_2, \ldots k_n$. This leads to very symmetric kernels in both the time-domain and the frequency-domain and super-symmetric factorization, which is described below.

To account for parameters that may drift over time and temperature, the device or system being compensated can be taken offline periodically for recalibration using the multi-tone harmonic probing approach discussed above.

The system can be adaptively calibrated in accordance with methods described above. In addition, correlation techniques can be used to estimate Volterra kernels for arbitrary inputs. Orthogonal factorizations of the Volterra kernels can be used for statistical independence, thereby simplifying the correlation measurements. The adaptive calibration can intelligently update factory calibration measurements and combine measurements over time, temperature, signal content, etc. as described above.

The calculation of Volterra kernel coefficients is performed with an over-constrained linear least mean squares filter design with filter weighting. A matrix of Volterra kernel coefficients is scaled by the measured complex frequency response. The real and complex parts are evaluated and subtracted from the measurement. This process is repeated for at least as many measurements as there are unique Volterra kernel coefficients. The kernel coefficients are calculated with an over-constrained least-squares solution with optional weighting of the form $$WAx=Wb,$$

Where W is the weighting function (to optionally weight certain measurements or frequencies), x is a vector of estimates of the time-domain Volterra kernel, b is a vector of real and imaginary frequency response measurements, and A is a matrix corresponding to the frequencies of each measurement. The solution for the optimal Volterra kernel x via the over-constrained least-squares problem is $$x=\text{inv}(A'W'WA)A'W'Wb)$$

This represents a very efficient, non-iterative solution via matrix algebra. Weighting is used to help ignore bands where signals will never fall. This approach can be extended to a MINIMAX (minimize maximum error signal), the implementation of which is apparent to one of ordinary skill in the art, by iteratively adjusting the weighting of each measured frequency by a factor proportional to its amplitude. Therefore, larger amplitude error signals will get a higher weighting. The iteration is continued until it converges to the MINIMAX solution.

The calculation of Volterra kernel coefficients is performed via interpolation and extrapolation to uniform frequencies such that the computationally-efficient inverse Fourier transform can be used to estimate the kernel. Data at measured frequencies can be interpolated and extrapolate (e.g., using a cubic spline) to a set of uniformly-spaced frequencies corresponding to those of a Fast Fourier Transform (FFT). The inverse FFT translates these frequency-domain measurements to time-domain Volterra kernels. Forcing conjugate symmetry in the FFT measurements insures that real-valued (not imaginary) coefficients will be calculated for the Volterra kernels. Most stable, realistic systems exhibit fading memory where the amplitudes of the Volterra kernels decrease to negligible levels as the Volterra matrix gets larger. This inverse FFT filter design method can be used to easily calculate very large Volterra matrices, much longer than the anticipated fading memory size. A large inverse FFT also avoids frequency aliasing which could otherwise decrease the accuracy of the calculated Volterra kernel coefficients. A subset of the Volterra kernel can be selected by windowing the matrix centered on the maximum magnitude kernel coefficients. However, this method does not have a frequency weighting capability, so it may not be the optimal solution for a different error criterion. In that case, it may be used as a starting point for other optimizations, such as an iterative solution.

The calculation of Volterra kernel coefficients is performed via an iterative linear or non-linear optimization. Volterra kernel coefficients can be iteratively adjusted and compared in a mean squares sense to the measured data, and the iteration continues until it converges to a solution.

For higher-order implementations of the factored Volterra compensator (i.e., order greater than 3), it becomes necessary to discriminate between overlapping kernels. Higher-order kernels have overlapping frequency components with lower-order kernels (e.g., some fifth-order intermodulation components are the same frequency as the third-order intermodulation components). The higher-order kernels can be measured at non-overlapping frequencies, followed by measuring the lower-order kernels by subtracting out overlapping components. Alternatively, kernels can be measured at multiple signal amplitudes and the different orders can be discriminated by their variations in amplitude (e.g., if the input amplitude is lowered by 1 dB, then the third-order components are reduced by 3 dB and the fifth-order components are reduced by 5 dB).

While it is possible to implement Volterra kernels as brute force multiplication and addition of all components, this is a very inefficient method requiring impractical amounts of processing resources, large size, high power consumption, and high cost. In an embodiment of the invention, the Volterra kernel is factored into dominant components and a very accurate but efficient implementation of the kernel is performed by implementing only the most significant components. Insignificant factors can be ignored to significantly reduce the size with negligible impact on the performance. A factorization (also called decomposition) method called Singular Value Decomposition (SVD) is effective for second-order Volterra kernels, and a factorization method called Tucker Decompositions is effective for higher-order Volterra kernels (i.e., $3^{rd}$ order and greater). As discussed above, symmetry of the Volterra kernel leads to super-symmetric factorizations, which are extremely efficient. Note that these factorizations are exact implementations of the Volterra kernel if all factorization components are implemented. However, the benefit of the factorizations is the ability to decompose the Volterra kernels into its factors, rank the factors by the significance of their contribution, and elect to implement the most significant factors necessary for the desired level of performance.

The Volterra kernels can be implemented as a parallel filter bank followed by a memoryless nonlinear combination of polynomials. If the memory of Volterra kernel is L (i.e., $h_n$ is an L×L×L× ... tensor), then there are at most L filters in the parallel filter bank, each with L coefficients. The maximum number of memoryless nonlinear combination is $L^k$ (L=memory, k=Volterra order). The coefficients are quantized for implementation in efficient fixed-point arithmetic. Alternatively, the implementation can be floating point arithmetic for improved accuracy but requiring more processing resources.

The Volterra kernels can be factored by implementing only the dominant diagonals and off-diagonals of Volterra kernel matrices. Often, the dominant energy in the Volterra kernel is concentrated on a few diagonals, so this factorization method can provide high accuracy with low computational complexity. A key to significantly reducing the complexity of implementing the Volterra filtering is to exploit the extreme symmetry inherent in the Volterra kernels, namely, $h_m[k_1, k_2, \ldots, k_m]$ are identically equal for all permutations of [$k_1, k_2, \ldots, k_m$]. This dramatically reduces the implementation complexity from $K^m$ total coefficients to $$\binom{K+m-1}{m}$$

unique coefficients. For example, a fifth-order Volterra kernel (m=5) with memory K=8 has 32,768 total coefficients, of which 792 are unique (a reduction of over 97%).

The unique, symmetric coefficients correspond to the diagonal and upper off-diagonal coefficients of the multi-dimensional Volterra kernels (which are matrices for two-dimensional kernels and tensors for higher order kernels greater than second order). Each diagonal and off-diagonal component can be efficiently implemented as an FIR filter. Each FIR filter can be rank-ordered by a measure of the energy in each (e.g., the sum of the squares of the filter coefficients). To reduce the complexity of the implementation, an accurate approximation of the Volterra kernel can be implemented by retaining only the FIR filters with energy above a prescribed threshold.

Figure 11:
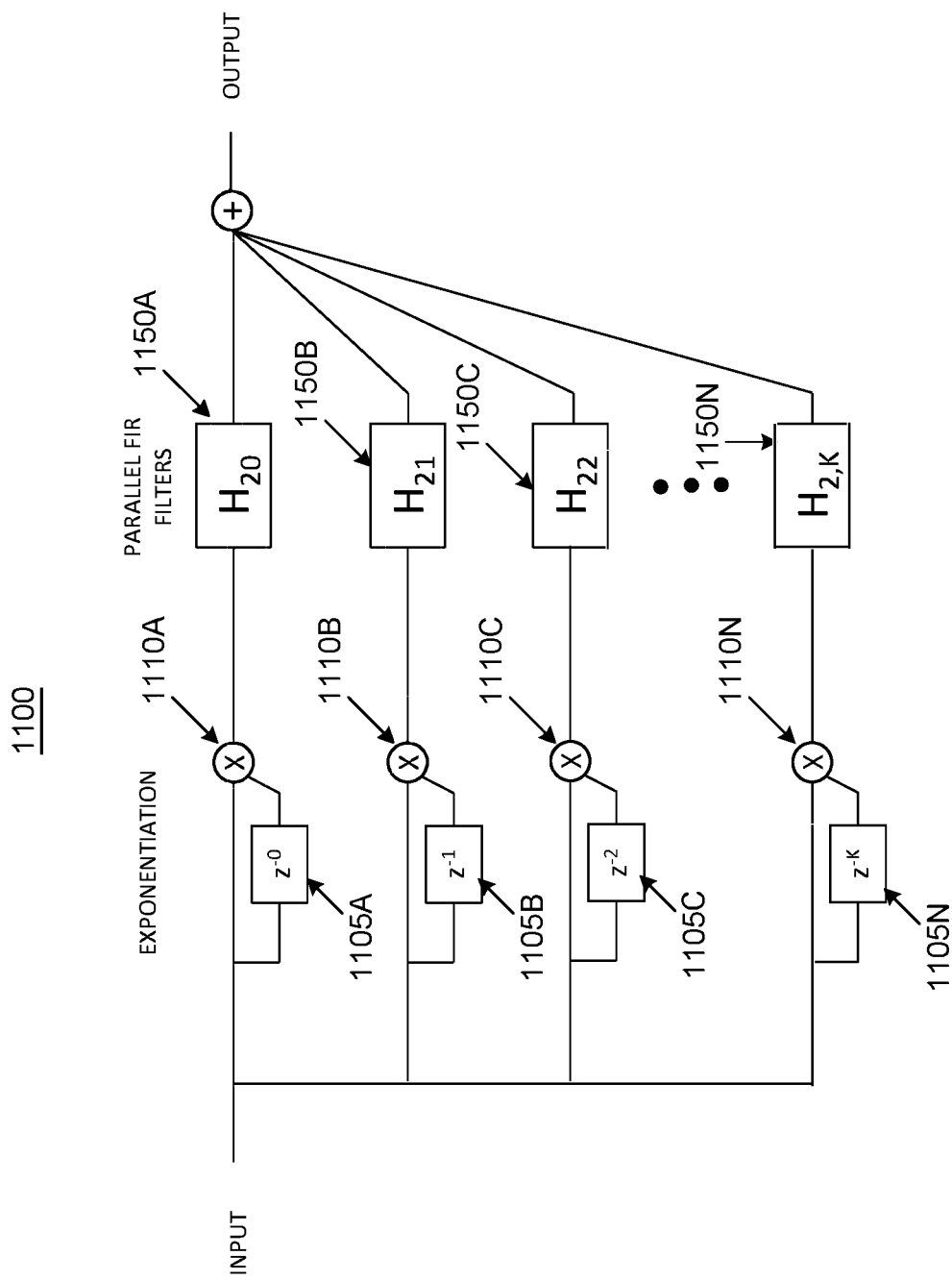
FIG. 11 illustrates the structure of the second-order factored Volterra compensator according to a preferred embodiment of the invention.

FIG. 11 depicts a preferred second-order Volterra kernel 1100 implemented with second-order exponentiators 1110A-N and parallel FIR filters 1150A-N. The parallel FIR filters correspond to the unique diagonal and upper off-diagonal coefficients of the Volterra kernel. The exponentiators 1110A-N are implemented with two-input multipliers whose inputs correspond to the Volterra filter input and a delayed version of the Volterra filter input using delays 1105A-N. The diagonal of the Volterra kernel corresponds to the case where the delay 1105A is zero, the first upper off-diagonal of the Volterra kernel corresponds to the case where the delay 1105B is one, and likewise for the other upper off-diagonals.

Figure 12:
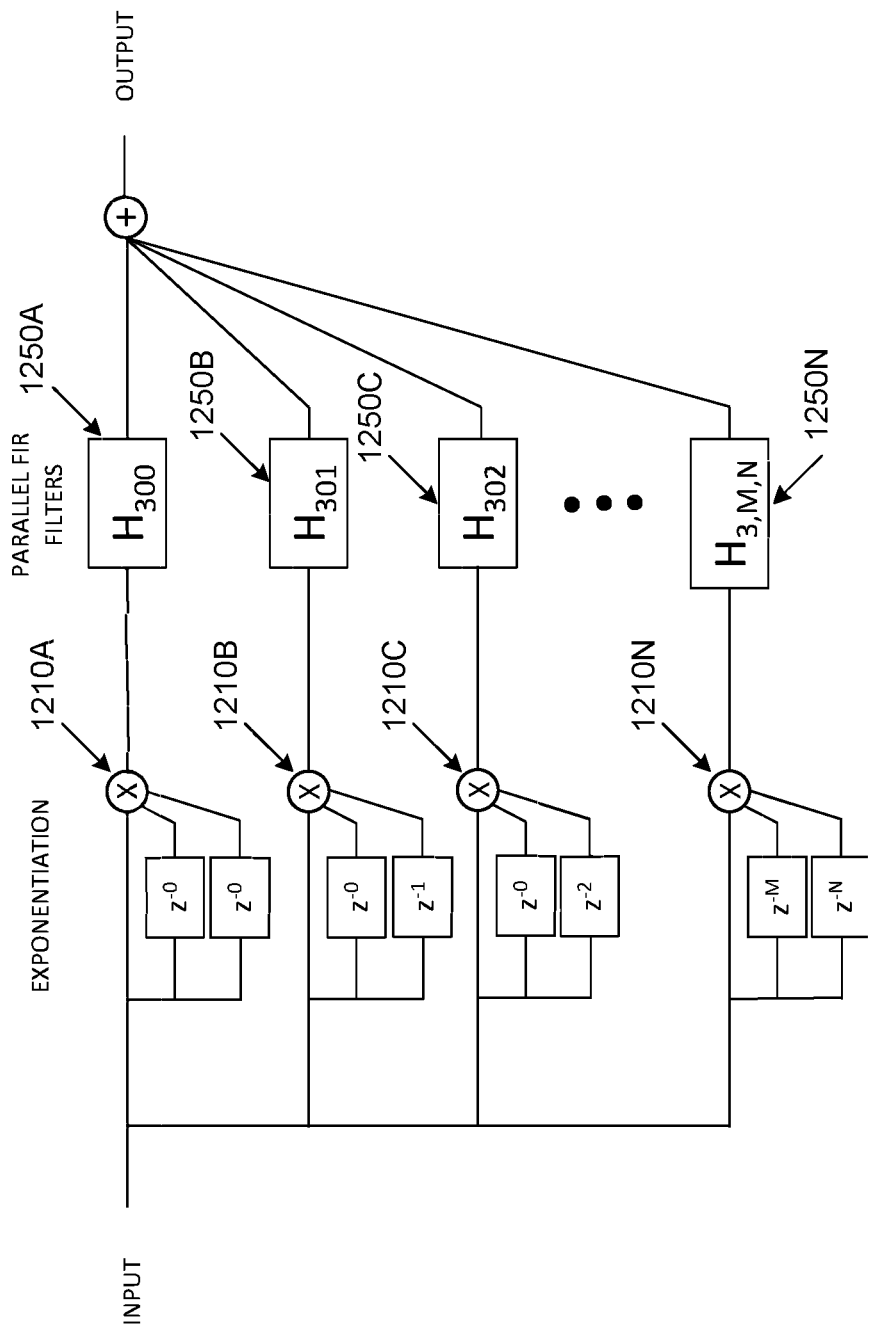
FIG. 12 illustrates the structure of the third-order factored Volterra compensator according to a preferred embodiment of the invention.

Similarly, FIG. 12 depicts a preferred third-order Volterra kernel implemented with third-order exponentiators 1210A-N and parallel FIR filters 1250A-N. Again, the parallel FIR filters correspond to the unique diagonal and upper off-diagonal coefficients of the Volterra kernel. The exponentiators 1210A-N are implemented with three-input multipliers whose inputs correspond to the Volterra filter input and delayed versions of the Volterra filter. This same structure is readily extended to higher order Volterra kernels for similarly efficient implementations of arbitrary order Volterra filters.

For very wideband applications, the second-order FIR filters 1150A-N in FIG. 11 can be implemented as previously described and shown in FIG. 7 in a parallel polyphase configuration 700 at a significantly reduced sample rate. Without this parallelization of the processing into numerous lower data rate paths, the extremely fast data rate would be beyond the capabilities of realizable hardware, such as digital signal processors (DSP), field programmable gate arrays (FPGA), or application specific integrated circuits (ASIC). Such parallelization may be implemented, for example, as polyphase finite impulse response (FIR) filters, the implementation of which is readily apparent to one of ordinary skill in the art. The third-order FIR filters 1250A-N in FIG. 12 and higher-order FIR filters (not shown) can be similarly implemented in a parallel polyphase configuration.

Once the Volterra kernels have been factored, they are rank ordered according to their significance (e.g., their singular values, Tucker factors, or other measurement of the relative energy in the Volterra kernel). Factored components are progressively included in the implementation until a desired level of performance or computational complexity limit has been reached. Once the Volterra kernels have been decomposed into their dominant factors, the compensation system for weakly nonlinear systems (i.e., a system where the nonlinear distortion is much, much smaller than the fundamental signals) is implemented by negating the Volterra kernels above the first order. The first order term passes the fundamental signal through the compensator in phase, and the kernels above the first order are negated such that they are subtracted from the output, thereby canceling the nonlinear distortion.

Figure 13:
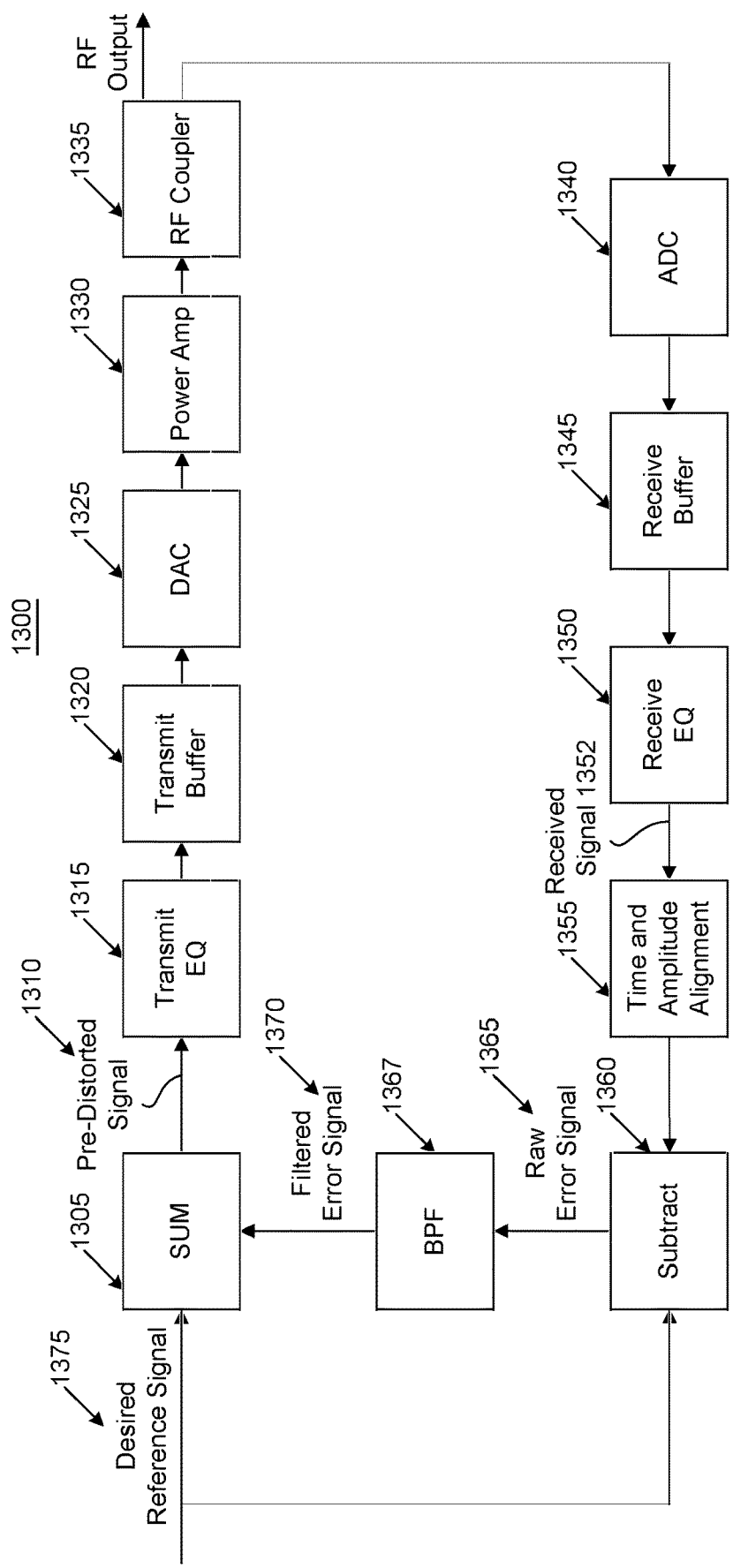
FIG. 13 illustrates a compensator calibration system.

To determine the appropriate Volterra kernel for a strongly nonlinear system (i.e., a system where the nonlinear distortion is roughly the same order as the fundamental signals), a preferred embodiment of the invention uses an iterative calibration algorithm 1300 to converge to a suitable result, as shown in FIG. 13. The iterative algorithm uses a series of multi-tone calibration signals with frequencies appropriately chosen to avoid overlapping distortion components, as described previously. Other non-sinusoidal signal types, such as pseudo-random, bandpass, spread spectrum or other modulated waveforms may also be used with this method.

During system calibration for a strongly nonlinear pre-compensation system such as digital pre-distortion of RF power amplifiers, for each calibration signal, the desired signal 1375 is iteratively adjusted to create a pre-distorted signal 1310 such that, when distorted by the RF power amplifier 1330, the output of the power amplifier 1330 closely matches the desired signal 1375.

The desired signal 1375 is digitally generated (e.g., on a computer or in an in-system embedded processor) and, on the first iteration of the algorithm, stored in a transmit buffer memory 1320 and converted to an analog signal with a digital-to-analog converter 1325. This signal is amplified by the RF power amplifier under test 1330 and the amplifier output is coupled with an RF coupler 1335 to an analog-to-digital converter 1340. The analog-to-digital converter output is captured in receive buffer memory 1345. The received signal 1352 accurately represents the output of the RF power amplifier 1330. The gain and delay of the received signal 1352 is adjusted in block 1355 (described further below) and compared to the desired signal 1375 via subtraction 1360 to create error signal 1370. On the second and subsequent iterations of the algorithm, the error signal 1370 is added to the desired signal 1375 with summer 1305 to create a new pre-distorted signal 1310. The process is repeated until the level of the error signal 1370 is below a prescribed threshold, indicating that the algorithm has converged to an appropriate solution. Once this occurs, both the desired signal 1375 and the final pre-distorted signal 1310 are saved in memory and the process is optionally repeated for another calibration signal.

The time and amplitude alignment block 1355 includes a digital gain element (e.g., a digital multiplier) to compensate for the gain of the RF power amplifier and a delay adjustment (e.g., delay elements) to compensate for the time delay of the DAC 1325 and transmit electronics (not shown), RF power amplifier 1330, RF coupler 1335, ADC 1340 and receive electronic (not shown).

The iterative calibration algorithm shown may optionally include a DAC equalization filter 1315 to compensate for any amplitude and phase distortion caused by the digital-to-analog converter and associated transmit electronics. The transmit electronics may include RF filters or mixers (not shown) to change the frequency of the transmitted signal. The algorithm may also optionally include an ADC equalization filter 1350 to compensate for any amplitude and phase distortion caused by the analog-to-digital converter and associated receive electronics. The receive electronics may include RF filters or mixers (not shown) to change the frequency of the received signal. The algorithm may optional include a bandpass filter 1367 to limit the bandwidth of the correction signal to a prescribed frequency band.

Once the iterative algorithm has been used with a multiplicity of calibration signals, the saved sets of corresponding desired signals 1375 and pre-distorted signals 1310 are used with the harmonic probing process previously described to determine the appropriate Volterra kernel or kernels. These Volterra kernels represent the pre-inverse Volterra filters that effectively compensate for the nonlinear distortion of a system such as an RF power amplifier. These Volterra filters can be efficiently implemented in hardware using the factorization techniques previously described.

The aforementioned approach, while providing excellent linearization in a calibrated laboratory environment, will yield sub-optimal performance when employed in the field due to a variety of changing conditions, such as temperature. By design, the above approach requires a priori fitting in order to learn the Volterra model necessary to effectively compensate the nonlinear distortion present. As a result, such a system requires a great deal of data in the calibration stage to attempt to capture the variety of conditions experienced in the hardware. The following approach, however, eliminates the need for a calibration stage by positing an adaptive approach to cancel out nonlinearities.

The present invention provides a dynamic or "on the fly" process of adaptively estimating a Volterra model predistortion linearizer for a nonlinear system without the need for any a priori model fitting. While the following derivation is shown for a third-order system, one of ordinary skill in the art can readily appreciates that it can be extended to higher orders.

Figure 14A:
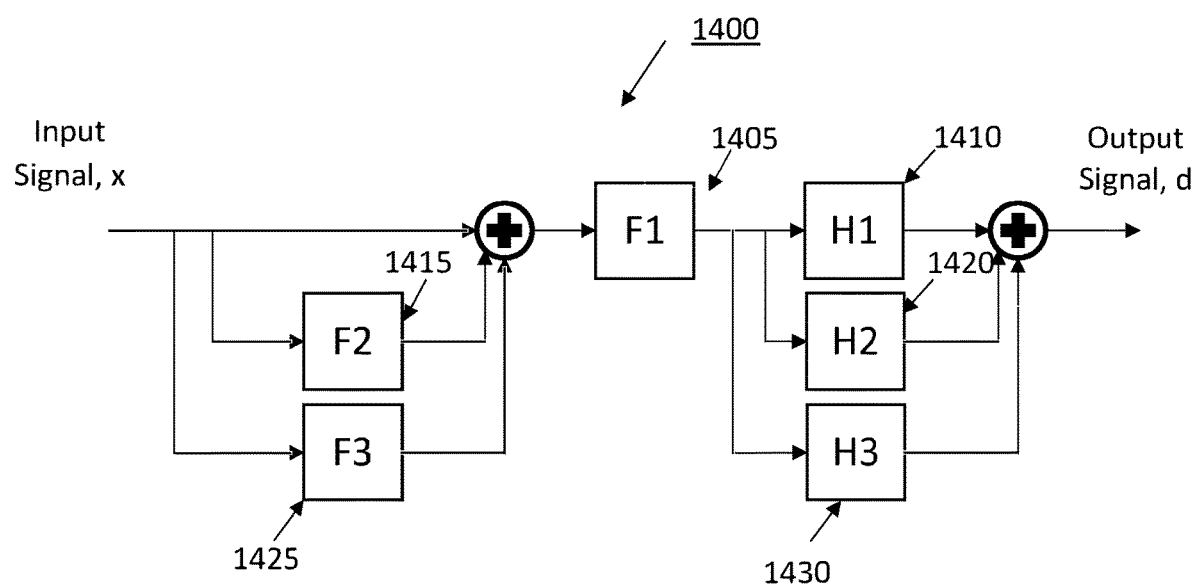
FIG. 14A illustrates adaptive estimation of third-order factored Volterra predistortion linearizer for a nonlinear system according to an embodiment of the invention.

FIG. 14A illustrates adaptive estimation 1400 of a third-order Volterra predistortion linearizer for a nonlinear system according to an embodiment of the invention. H1-H3 represent a third-order Volterra nonlinear system comprising first-order Volterra kernel 1410, second-order Volterra kernel 1420, and third-order Volterra kernel 1430. F1-F3 represent a third-order Volterra predistortion linearizer comprising first-order inverse Volterra kernel 1405, second-order inverse Volterra kernel 1415, and third-order Volterra kernel 1425. The inverse Volterra kernels 1405-1425 receive an input signal, x, and, once processed through the Volterra nonlinear system represented by Volterra kernels 1410-1430, produce the output signal, d, such that the nonlinearities have been cancelled.

The nonlinear device being linearized, such as an RF power amplifier, is mathematically modeled as a Volterra nonlinear system comprising Volterra kernels 1410-1430 using an adaptive estimation algorithm described below. These Volterra kernels 1410-1430 are then used to calculate the corresponding inverse Volterra kernels 1405-1425 to cancel the nonlinear distortion introduced by the nonlinear device in a process also described below.

In a preferred embodiment, the inverse Volterra kernels 1405-1425 can be implemented in hardware for realtime processing as a second-order Volterra kernel 1100 shown in FIG. 11 and third-order Volterra kernel shown in FIG. 12. For very wideband applications, the kernels can be implemented as previously described and shown in FIG. 7 in a parallel polyphase configuration 700 at a significantly reduced sample rate.

In another embodiment, the actual inverse Volterra filters 1405-1425 are implemented in realtime hardware such as FGPA as shown in FIG. 11 and FIG. 12 (with polyphase filtering shown in FIG. 7). The Volterra kernels 1410-1430 are not implemented but instead are interim calculations used to determine the inverse Volterra filters 1405-1425.

The optimal inverse of an $N^{th}$ order Volterra system is defined as:

$$Y_N = Y_1 - F_1 \sum_{k=2}^{N} H_k Y_{N-k+1}, \text{ where } Y_1 = F_1 * x \text{ and } F_1 = \frac{1}{H_1}$$

Iteratively computing this compounds the effects of F1, which requires a good estimate of H1. By predistorting the system with F1, the presence of H1 is effectively cancelled out and a new system is produced where the inverse does not depend on H1 (nor does it depend on a need to estimate it):

$$Y_N = x - \Sigma_{k=2}^{N} H_k Y_{N-k+1}.$$

For a third-order system:

$$Y_3 = x - H_2 Y_2 - H_3 Y_1 = x - H_2 * x - H_3 * x + H_2 * (H_2 * x)$$

The last term will generally produce higher order terms that will be smaller than the nonlinearity to be removed, so this term can be omitted to yield:

$$Y_3 = x - H_2 * x - H_3 * x = x + F_2 * x + F_3 * x$$

This is the system modeled by F2 and F3. Although only a single iteration is depicted in FIGS. 14, F2 and F3 are iteratively estimated as the system is predistorted.

To estimate the approximate inverse F1

$$\left(\text{or } \frac{1}{H1}\right),$$

the system is probed with low amplitude single tone signals across the whole Nyquist band, the output is measured, and F1 is recorded as the quotient of the frequency response of the input signal and frequency response of the output signal. These measurements are interpolated and the used for the design of the FIR filter. Once the inverse of H1 is estimated, the system is predistorted with it in order to estimate the pseudo-inverse, F1.

For each iteration, 1420 (H2) and 1430 (H3) are estimated via a modified recursive least squares (RLS) algorithm. The standard RLS algorithm steps are described by equations 1-6 and the inventive steps are described by equations 7-9 as follows. For N iterations, compute the following:

$$k(n) = \frac{\lambda^{-1} P(n-1) u(n)}{1 + \lambda^{-1} u^H(n) P(n-1) u(n)} \qquad \text{(equation 1)}$$

$$y(n) = w^T(n-1) u(n) \qquad \text{(equation 2)}$$

$$e(n) = d(n) - y(n) \qquad \text{(equation 3)}$$

$$w(n) = w(n-1) + k(n) e(n) \qquad \text{(equation 4)}$$

$$P(n) = \lambda^{-1} P(n-1) - \lambda^{-1} k(n) u^H(n) P(n-1) \qquad \text{(equation 5)}$$

$$mse(n) = e(n) * e(n) \qquad \text{(equation 6)}$$

$$mse10(n) = \frac{1}{10}\sum_{k=n-9}^{n} mse(k) \quad \text{(equation 7)}$$

$$mse100(n) = \frac{1}{100}\sum_{k=n-99}^{n} mse(k) \quad \text{(equation 8)}$$

if($mse10(n)-mse100(n)$>5 dB),reset $P(n)$ to $I$     (equation 9)

where $\lambda^{-1}$ denotes the reciprocal of the exponential weighting factor (also called the forgetting factor), n is the current time index, u(n) is the vector of input samples, P(n) is the inverse correlation matrix, k(n) is the gain vector, w(n) is the filter tap estimates of the vectorized Volterra coefficients, y(n) is the estimated output of the filter, e(n) is the estimation error, and d(n) is the desired output, mse(n) is the mean-squared error (MSE), mse10 is a 10-sample moving average of the MSE, mse100 is a 100-sample moving average of the MSE, and I is the identity matrix.

The standard RLS algorithm computes the mean-squared error sample-by-sample to find the optimal solution. However, in order to allow filtering to be incorporated into the model, the output of the system is estimated for the full data vector at each iteration. This provides a more robust and stable objective function than the sample-by-sample mean-squared error computation. Once the MSE is computed for all N iterations, optimization over all coefficients is performed by choosing the coefficients that minimize the objective function $\min_{k}[\text{std}[d-y(k)]]$.

The system is then predistorted with the estimated F2 and F3, and the estimation is repeated until convergence. F2 and F3 are computed as the negated accumulation of the H2 and H3 estimates from pervious iterations scaled by a convergence controlling factor, alpha. In other words:

$$F_2(n) = -\alpha \sum_{i=1}^{n-1} H_2(i)$$

$$F_3(n) = -\alpha \sum_{i=1}^{n-1} H_3(i)$$

Figure 14B:
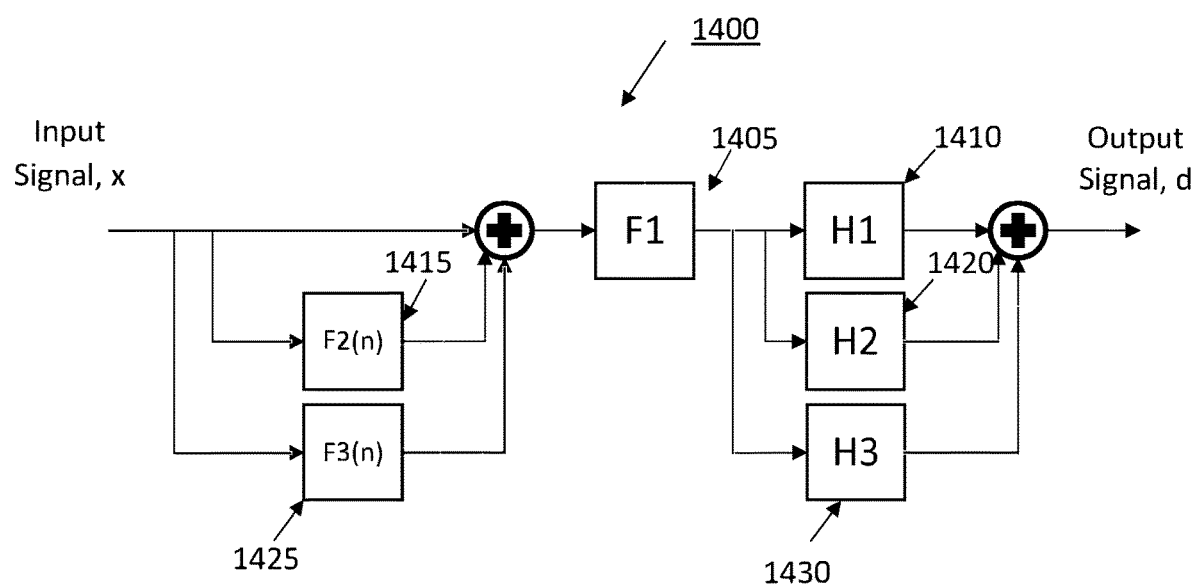
FIG. 14B illustrates adaptive estimation of third-order factored Volterra predistortion linearizer for a nonlinear system at iteration n according to an embodiment of the invention.

FIG. 14B illustrates adaptive estimation 1400 of third-order factored Volterra predistortion for a nonlinear system at iteration n according to an embodiment of the invention.

In a preferred embodiment, the adaptive estimation algorithm described above can be implemented as firmware in a processor such as a digital signal processor (DSP), embedded processor, or a microprocessor. For faster update rates, some of the computations can be implemented in dedicated hardware such as FPGA or ASIC logic. Furthermore, the implementation of the actual compensator in the FPGA is simply 1405-1425 (F1-F3) with its adder. The output of 1405 (F1) represents the predistorted signal which feeds the device being linearized (e.g., RF power amp) such that the output of the device, output signal d, is linearized (i.e., the nonlinear distortion is cancelled). The Volterra kernels 1410-1430 (H1-H3) with its adder is a mathematical model of the device with output signal d.

For bandpass systems in which the waveforms are limited to a certain sub-bandwidth, "prefiltering" the signal is effective since, without the prefiltering, the system is expecting components over a wider bandwidth. In an embodiment of the invention, a bandpass filter is used to filter the data to the desired bandwidth and this filter is included directly in the kernel estimation; the algorithm is able to concentrate on the desired inband signals while ignoring the out-of-band signals. A system that concentrates on the desired inband signals greatly simplifies the Volterra filter design algorithm (described above) and greatly reduces the size of the hardware implementation (since the many zero coefficients correspond to simple time delays instead of full multipliers).

Figure 15:
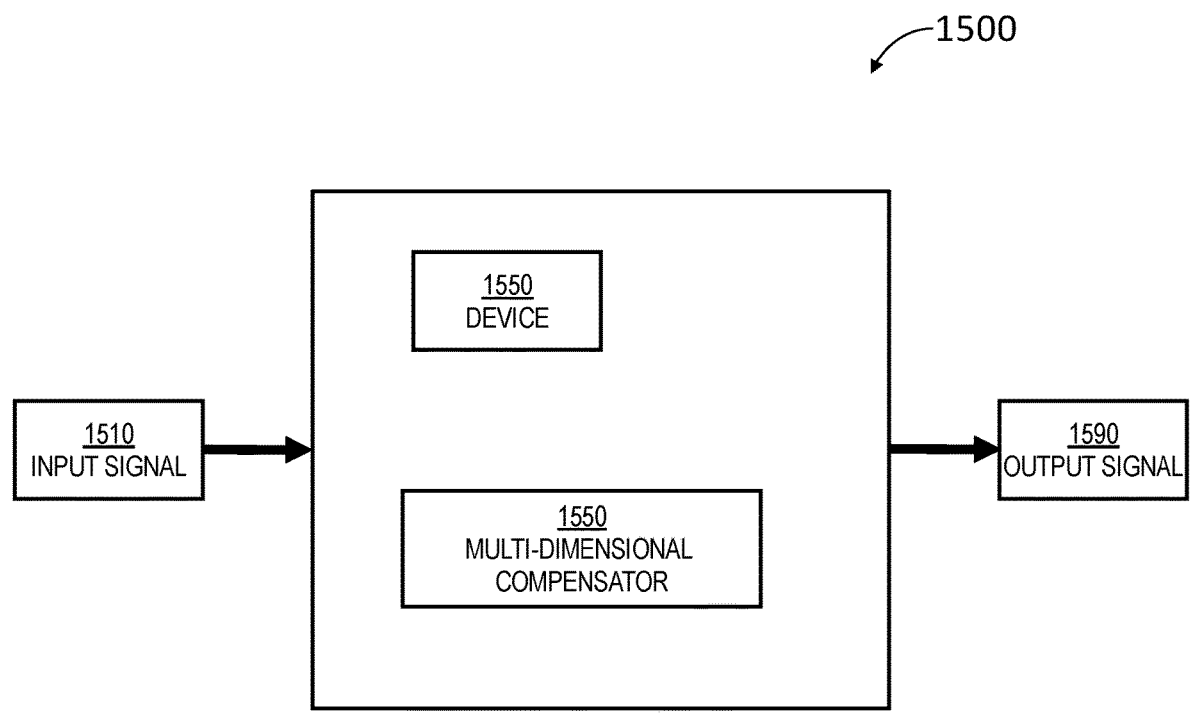
FIG. 15 illustrates a compensated system.

FIG. 15 illustrates a multi-dimensional compensation system 1500 of a device 1540 exhibiting distortion. Ideally, the system output signal 1590 is simply an amplitude-scaled and delayed version of the system input signal 1510. However, the device 1540 may introduce distortion components such as non-linear distortion, frequency-dependent amplitude and phase errors, in-phase and quadrature mismatch errors, time-interleaving mismatch errors, DC-offset distortion, or other distortion, the identification of which is apparent to one of ordinary skill in the art, that output signal 1590 is not simply an amplitude-scaled and delayed version of the input signal 1510. A multi-dimensional compensator 1550 is used to model these errors such that they can be canceled in the output signal 1590.

In a preferred embodiment of the invention, the multi-dimensional compensator 1550 is implemented in digital signal processing software, firmware, or hardware (or a combination of two or more of these implementations), the general implementation of which are apparent to one of ordinary skill in the art. Therefore, for devices 1540 that include conversion from analog signals to digital signals, the multi-dimensional compensator 1550 would be implemented after the device 1540 (referred to as "post-compensation"). Similarly, for devices 1540 that include conversion from digital signal to analog signals, the multi-dimensional compensator 1550 would be implemented before the device 1540 (referred to as "pre-compensation"). This is described more fully below with reference to FIG. 21 and FIG. 22.

Still referring to FIG. 15, the multi-dimensional compensator 1550 can be configured to operate on real or complex signals. Real signals are often used in direct sampled digital systems with no digital or analog RF upconversion or downconversion. Complex signals are used in systems that use downconversion mixers to frequency shift real RF signals to become complex (i.e., real and imaginary valued) baseband signals. The processing and architectures described herein function for real or complex signals. Complex processing can be performed in Cartesian coordinates (i.e., real and imaginary values) or polar coordinates (i.e., magnitude and phase values), the implementation of which is apparent to one of ordinary skill in the art.

Figure 16:
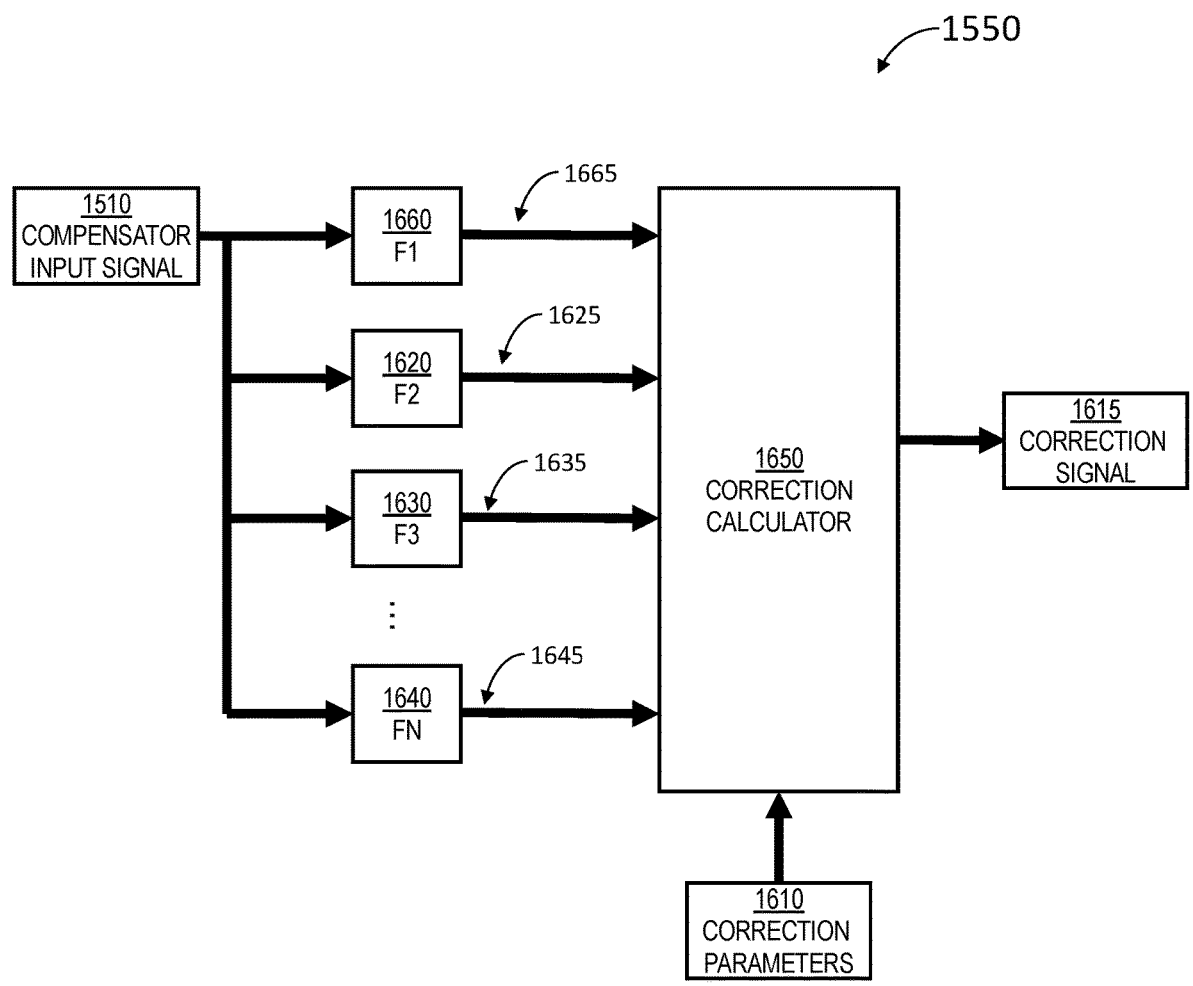
FIG. 16 illustrates a multi-dimensional compensator.

Referring to FIG. 16, the multi-dimensional compensator 1550 includes a correction calculator 1650. The multi-dimensional inputs to the multi-dimensional compensator 1550 include two or more functions 1660, 1620, 1630 and 1640 of the compensator input signal 1605. The correction calculator 1650 also takes as input a set of correction parameters 1610 which define the operation of the multi-dimensional compensator 1550. The correction parameters 1610 are described more fully below with reference to FIG. 22 and FIG. 23.

Still referring to FIG. 16, the functions $F_1$ 1660, $F_2$ 1620, $F_3$ 1630, and $F_N$ 1640 define the current state of the device such that the correction calculator 1550 can calculate a different correction value depending on the current state of the device. Here, N refers to the number of functions 1660, 1620, 1630, 1640 that are implemented in the multi-dimensional compensator 1550-N is also the number of dimensions of the multi-dimensional compensator 1550. To simplify discussion, only four functions 1660, 1620, 1630, and 1640 are described, i.e., N=4. However, N can be greater than 4. These functions 1660, 1620, 1630, and 1640 are implemented, for example, in a field programmable gate array (FPGA) or application specific integrated circuit (ASIC) to provide a corresponding output signal 1665, 1625, 1635, and 1645 based on mathematical operations on the compensator input signal 1605. In an embodiment of the invention, the multi-dimensional compensator 1550 is implemented in a digital signal processor. These functions 1660, 1620, 1630, and 1640 may include but are not limited to the following: present compensator input signal 1605 value; the delay function; the derivative function (including higher order derivative); the integral function (including higher order integrals); signal statistics (such as mean, median, standard deviation, variance); the covariance of the compensator input signal 1605 with delayed values of the compensator input signal 1605; the power of the compensator input signal 1605 (including the RMS and peak power measurements); and polynomial functions of the compensator input signal 1605. The function signals 1625, 1635, and 1645 provide additional information on the state of the device compared to just using the compensator input signal 1605 alone, which helps model and cancel distortion signals that vary, for example, as a function of frequency or exhibit other memory effects such as hysteresis. However, with reference to exemplary embodiment shown in FIG. 16, all functions 1620, 1630, and 1640 are derivative functions of various orders. Again, functions 1620, 1630, and 1640 can be functions other than derivatives as noted above.

Still referring to FIG. 16, in a preferred embodiment, the first differentiator function 1620 is used to calculate the first derivative of the compensator input signal 1605 to form the first derivative signal 1625. The first derivative corresponds to the rate of change (also referred to as the velocity) of the compensator input signal 1605. The second differentiator function 1630 is used to calculate the second derivative of the compensator input signal 1605 to form the second derivative signal 1635. The second derivative corresponds to the rate of change of the first derivative signal 1625 (also referred to as the acceleration of the compensator input signal 1605). The $M^{th}$ order differentiator function 1640 is used to calculate the $M^{th}$ derivative of the compensator input signal to form the $M^{th}$ derivative signal 1645. The implementation of the differentiators 1620, 1630, and 1640 is described more fully below with reference to FIG. 18A, FIG. 18B, and FIG. 18C. N can be any value. In this preferred embodiment, the function $F_1$ 1660 corresponds to the present compensator input signal 1605 value.

Still referring to FIG. 16, the correction calculator 1650 provides as output the correction signal 1615. As described more fully below with reference to FIG. 21 and FIG. 22, the correction signal 1615 is appropriately applied to the device 1540 to negate the distortion in the system output signal 1590; the correction signal 1615 is applied differently for a post-compensation system compared to a pre-compensation system.

Figure 17A:
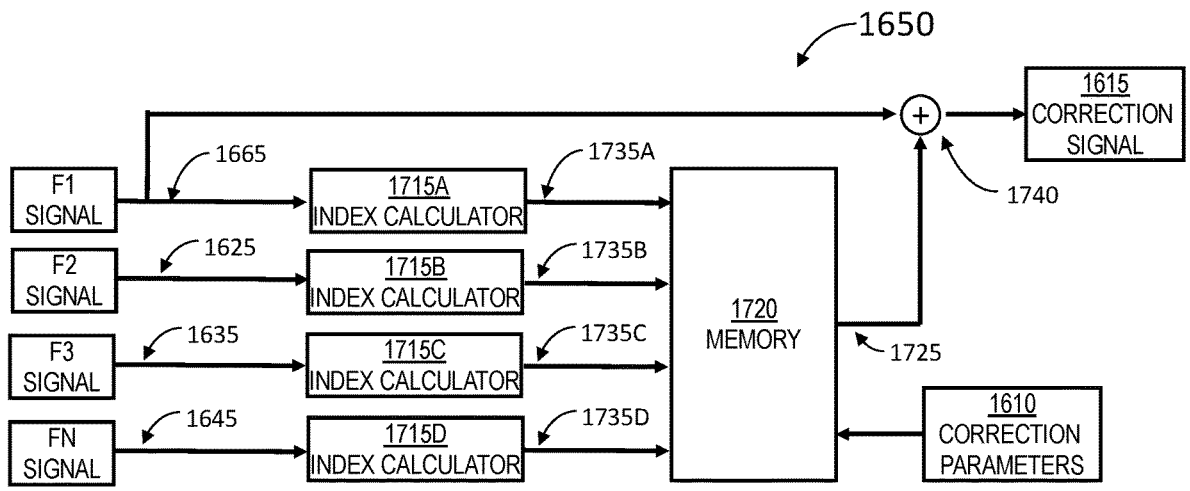
FIG. 17A illustrates a memory-based correction calculator.

In a preferred embodiment of the invention, FIG. 17A illustrates a memory-based implementation of a correction calculator 1650. A memory 1720 is used to store different correction values that are a function of the compensator input signal 1605 and one or more derivative signals 1625, 1635, and 1645. Index calculators 1715A, 1715B, 1715C, and 1715D translate the corresponding compensator input signal 1605 and derivative signals 1625, 1635, and 1645 into corresponding memory location indices 1735A-D. These indices define which location in the memory 1720 to provide the correction value 1725. The memory 1720 can be implemented in a software memory variable or in hardware, for example, as a random-access memory (RAM), the implementation of which are apparent to one of ordinary skill in the art. The correction value 1725 is summed using an adder 1740 with the compensator input signal 1605 to form the correction signal 1615.

As mentioned above, the index calculators 1715A-D translate the corresponding compensator input signal 1605 and derivative signals 1625, 1635, and 1645 into corresponding memory location indices 1735A-D. Being a digital signal processing system, the compensator input signal 1605 and derivative signals 1625, 1635 and 1645 are all quantized values. The level of quantization (as defined by the number of digital bits used to represent these values) is determined during the system design stage to have enough resolution to accurately represent the desired signals with minimal quantization error using design techniques apparent to one of ordinary skill in the art. A practical number of bits to implement for the $F_1$ output signal 1660 typically ranges from 8 to 12 bits for the $F_1$ output signal 1665 when the function $F_1$ 1660 is the present value function (i.e., when no function is used, such that the $F_1$ output signal 1665 equals the compensator input signal 1605). Otherwise, a practical number of bits to implement for function output signals 1660, 1620, 1630, and 1640 typically ranges from 4 to 8 bits. The memory location indices 1735A-D are also quantized, and the level of quantization of the indices defines how large (i.e., the number of memory entries) the memory 1720 is. Reducing the size of the memory 1720 is desirable to reduce the size, weight, and power of a hardware implementation.

Still referring to FIG. 17A, determining relevant system parameters such as which order derivatives N to use and the size of the memory 1720 can be performed with an experimental trade-off study. A trade space is defined for each of the system parameters, and for each different setting of the system parameters, the system is calibrated, and the performance is evaluated. Methods for system calibration and performance evaluation are described below. Once the performance has been evaluated for each of the system parameter settings, the designer is able to choose the implementation that provides the desired level of performance and the corresponding size. This can be used, for example, to determine which order derivatives to use, the number of quantization levels for the compensator input signal 1605, and the number of quantization levels for each of the derivative signals 1625, 1635, and 1645. In addition to the number of quantization levels, the type of quantization can also be evaluated. Uniform quantization divides the range of the signal into equal quantization steps, i.e., quantization levels are uniformly spaced. Conversely, non-uniform quantization divides the range of the signal into unequal quantization steps. i.e., quantization levels are unequal—relationship can be logarithmic. Rounding and truncation are typical examples of quantization processes, the identification and implementation of which are apparent to one of ordinary skill in the art. Smaller quantization steps can be allocated to areas where more performance is needed (for example, for large magnitude values of the compensator input signal 1605 where nonlinear compression effects are prominent) and larger quantization steps can be allocated to other areas (for example, small magnitude values of the compensator input signal 1605 where nonlinear compression effects are negligible). Non-uniform quantization can sometimes provide similar performance to uniform quantization, but with much fewer quantization levels, thereby reducing the size, weight, power, and cost of a hardware implementation.

The index calculators 1715A-D quantize their input signals to the number of quantization states as determined above. Each quantization state is assigned a unique value which represents the index of the memory. For example, if the system has been designed to use 16 values of the first derivative, then the index calculator 1715B will quantize first derivative signal 1625 into 16 different values (using uniform or non-uniform quantization steps as described above). Each of those 16 different values is then assigned a memory index value in the range of 0 to 15, which forms the memory location index 1735B. The index calculator 1715A for the compensator input signal and the index calculators 1715C-D for higher order derivatives are implemented analogously, but they do not necessarily need to be quantized to the same number of values as each other. Also, the quantization of the derivative signals 1625, 1635, and 1645 may be different as a function of the compensator input signal 1605 since the rang of values for the derivative signals 1625, 1635, and 1645 varies with the value of the compensator input signal 1605.

Figure 17B:
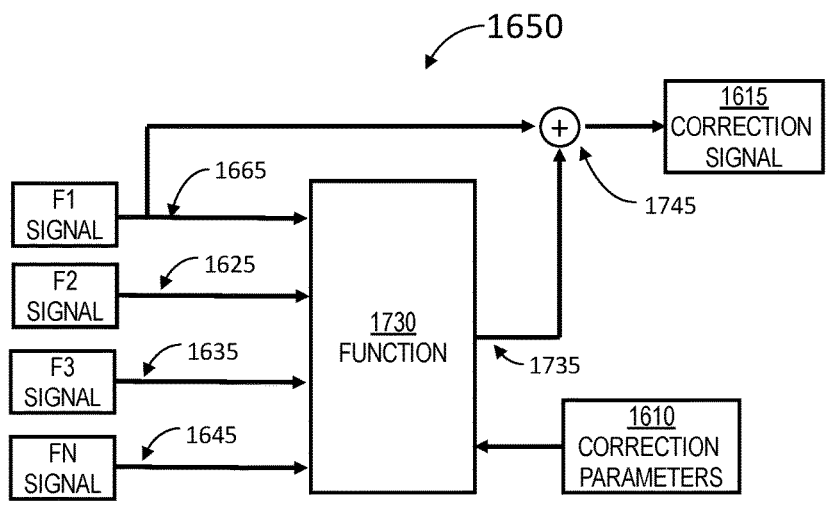
FIG. 17B illustrates a function-based correction calculator.

FIG. 17B illustrates an alternative implementation of the correction calculator 1650 that is based on the evaluation of a corrective function 1730 (instead of addressing a memory 1720). The corrective function 1730 is the implementation and evaluation of mathematical formula that takes as input the compensator input signal 1605 and the derivative signals 1625, 1635, and 1645 and calculates the correction value 1735. The corrective function 1730 can be, for example, a polynomial equation, a spline, a finite-impulse response (FIR) filter, a Volterra nonlinear filter, a nonlinear memory polynomial, or a combination of these. Different functions can be applied to different values of, for example, the compensator input signal 1605 or derivative signals 1625, 1635, or 1645. In one embodiment of the invention, a separate polynomial function is used for each quantized version of the first derivative signal 1625. The correction value 1735 is summed using an adder 1745 with the compensator input signal 1605 to form the correction signal 1615.

Figure 18A:
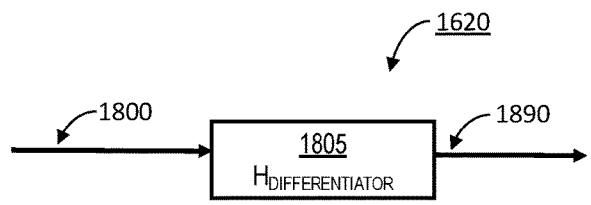
FIGS. 18A, 18B, and 18C illustrate methods for calculating the derivative of a signal.
Figure 18B:
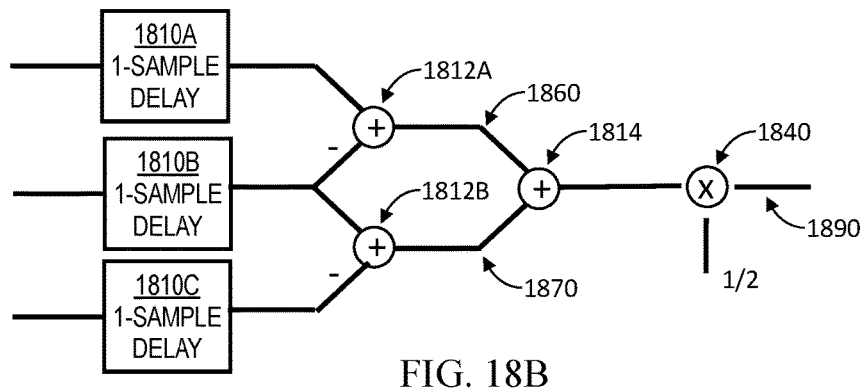
Figure 18C:
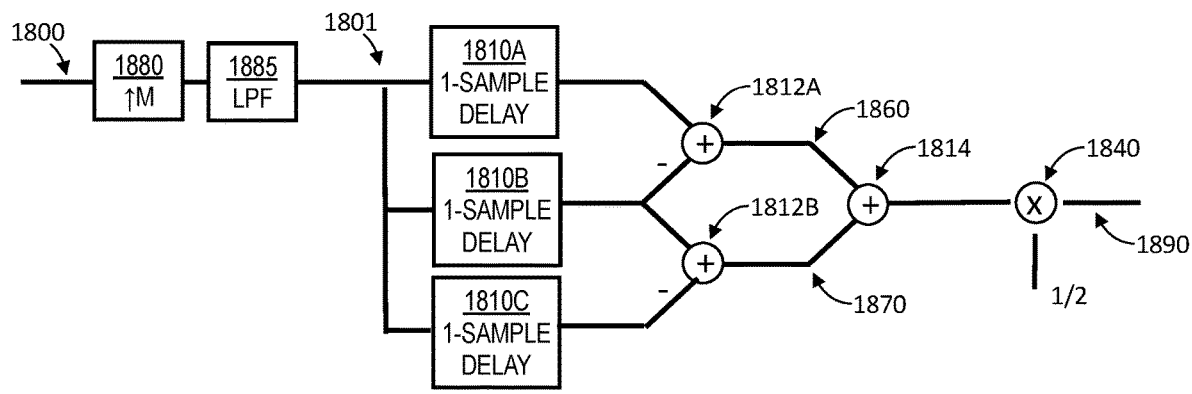

FIGS. 18A-C illustrate three different methods of implementing the first differentiator 1620. Referring to FIG. 18A, the derivative d[n] 1890 of the input signal x[n] 1800 can be obtained by filtering:

$$d[n]=h[n]*x[n]$$

where h[n] 1805 is a FIR filter that operates under the principal that the time domain derivative of a signal x[n] 1800 corresponds to $j\omega X(e^{j\omega})$ in the frequency domain. Therefore, the derivative calculation can be calculated by a digital filter that has the frequency response $j\omega$. Note that special consideration is given to the length of the filter so that the filter delay is an integer so that it can be easily aligned with other data by using simple delay blocks.

Still referring to FIG. 18A, higher order derivatives can be calculated by the series combination of multiple first-order differentiators 1620. For example, to implement a second-order differentiator 1630 in FIG. 16, two first-order differentiators 1620 can be combined in series, where the output of the second first-order differentiator corresponds to the second derivative signal 1635. This process can be repeated to implement higher order differentiators.

Referring to FIG. 18B, a lower complexity alternative to calculating the derivative of an input signal 1800 uses first differences. A forward first difference 1860 and a backward first difference 1870 are averaged to estimate the first derivative 1890. The forward first difference 1860 is formed by subtracting 1812A the output of a 2-sample delay 1810B from the output of a 1-sample delay 1810A. The backward first difference 1870 is formed by subtracting 1812B the output of a 3-sample delay 1810C from the output of a 2-sample delay 1810B. The forward first difference 1860 and the backward first difference 1870 are averaged by adding 1814 them together and multiplying 1840 by one-half to form an estimate of the first derivative signal 1890. This method for implementing the derivative is computationally efficient (i.e., smaller size, weight, power, and cost) since it does not use any filtering or multipliers, but the result is generally not as accurate as using the filtering approach of FIG. 18A.

Referring to FIG. 18C, interpolation can be used to improve the accuracy of the first difference method of estimating the derivative shown in FIG. 18B. The input signal 1800 is first upsampled by a factor of M using the upsampler 1880. The output of the upsampler 1880 is then low-pass filtered 1885 to form the interpolated input signal 1801. In general, the lowpass filter 1885 has cutoff at it/M. The interpolated input signal is then processed with the sample first difference technique show in FIG. 18B. The definition of the derivative is the instantaneous rate of change of signal, so this technique converges to an accurate estimate of the derivative as the interpolation factor M gets larger. In practice, a value of M=4 is usually sufficient to provide accurate estimation of the derivative.

Figure 21:
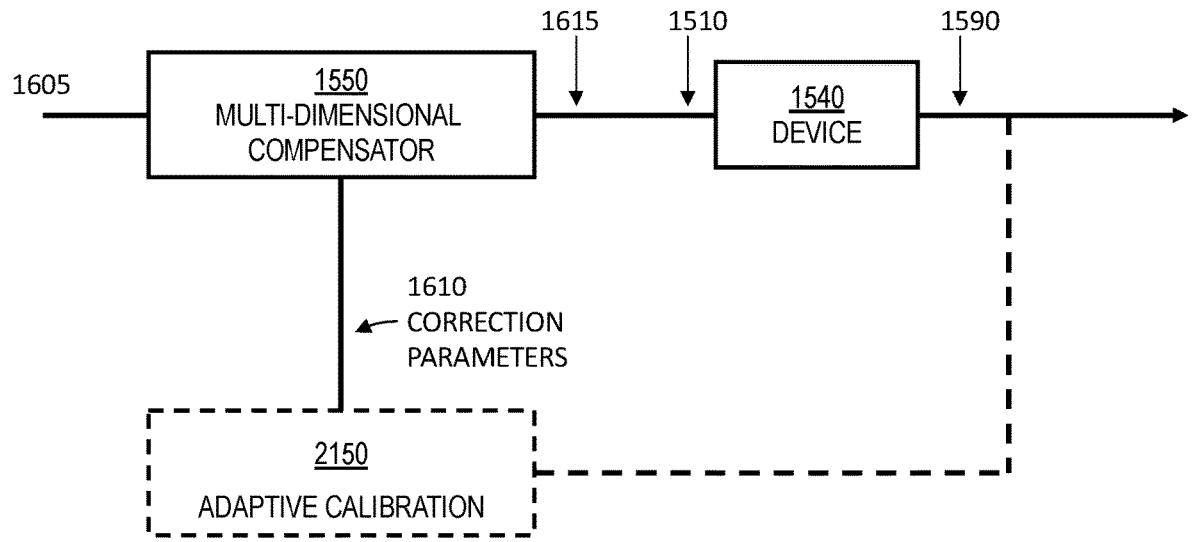
FIG. 21 illustrates a multi-dimensional compensator in a pre-compensation configuration.

As mentioned previously in reference to FIG. 15, for devices 1540 that include conversion from digital signal to analog signals, the multi-dimensional compensator 1540 would be implemented before the device 1540 (referred to as "pre-compensation"). FIG. 21 illustrates a pre-compensation configuration. In this case, the system input signal 1510 feeds the input 1605 to the multi-dimensional compensator 1550 to form the correction signal 1615. The correction signal 1615 is fed to the input of the device 1540 such that the distortion in the output signal 1590 has been canceled. In a preferred embodiment of the invention, the multi-dimensional compensator 1550 can be calibrated in the background using adaptive calibration 2150. The adaptive calibration 2150 takes as input the system output signal 1590 and the system input signal 1510 and provides as output a set of updated correction parameters 1610. The adaptive calibration 2150 is described more fully below in reference to FIG. 23.

Figure 22:
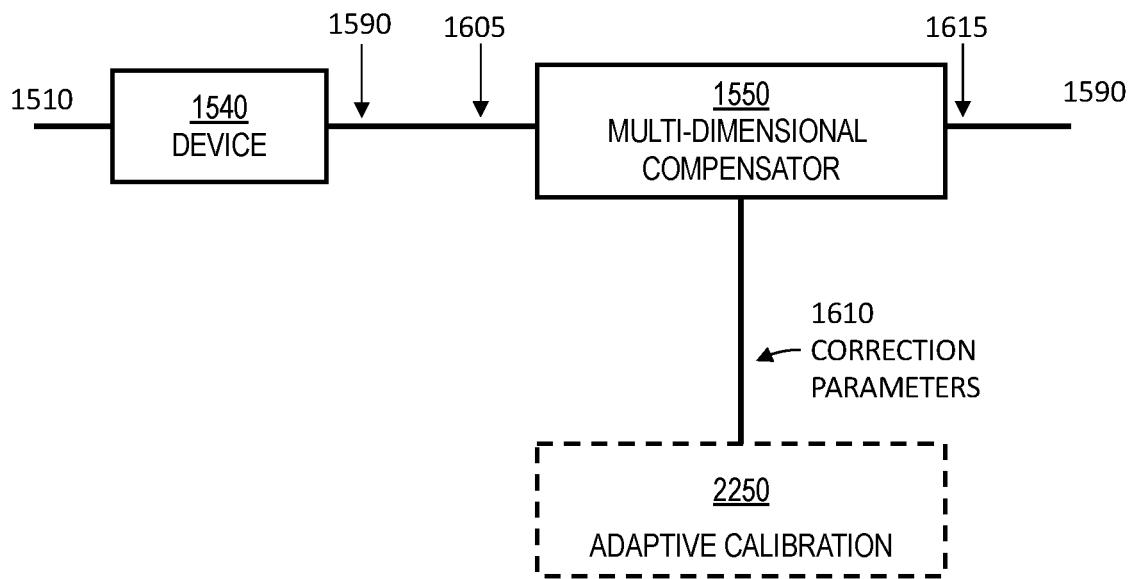
FIG. 22 illustrates a multi-dimensional compensator in a post-compensation configuration.

As also as mentioned previously in reference to FIG. 15, for devices 1540 that include conversion from analog signals to digital signals, the multi-dimensional compensator 1540 would be implemented after the device 1540 (referred to as "post-compensation"). FIG. 22 illustrates a post-compensation configuration. In this case, the system input signal 1510 feeds the input to the device 1540 and the output of the device 1540 feeds the input 1605 to the multi-dimensional compensator 1550. The multi-dimensional compensator 1550 outputs the correction signal 1615 such that the distortion in the output signal 1590 has been canceled. In an embodiment of the invention, the multi-dimensional compensator 1550 can be calibrated in the background using adaptive calibration 2250. Adaptive calibration 2250 provides as output a set of updated correction parameters 1610. Adaptive calibration 2250 for the post-compensation configuration is described more fully below.

In another embodiment of the invention, the correction parameters 1610 in FIG. 22 for the post-compensation system are calculated with a non-adaptive calibration. For example, a one-time factory calibration can be used to calculate and store the correction parameters 1610. The factory calibration may include different calibration conditions, for example, over temperature, tune frequency, power level, or other factors, the identification of which are apparent to one of ordinary skill in the art, that may change over time, where different correction parameters 1610 are calculated, stored, and loaded into the multi-dimensional compensator 1550 as needed. In another embodiment of the invention, the correction parameters 1610 can be calculated periodically with in-system calibration where the normal operation of the device 1540 is temporarily interrupted to inject one or more known calibration signals into the device 1540 to calculate updated correction parameters 1610.

Figure 28:
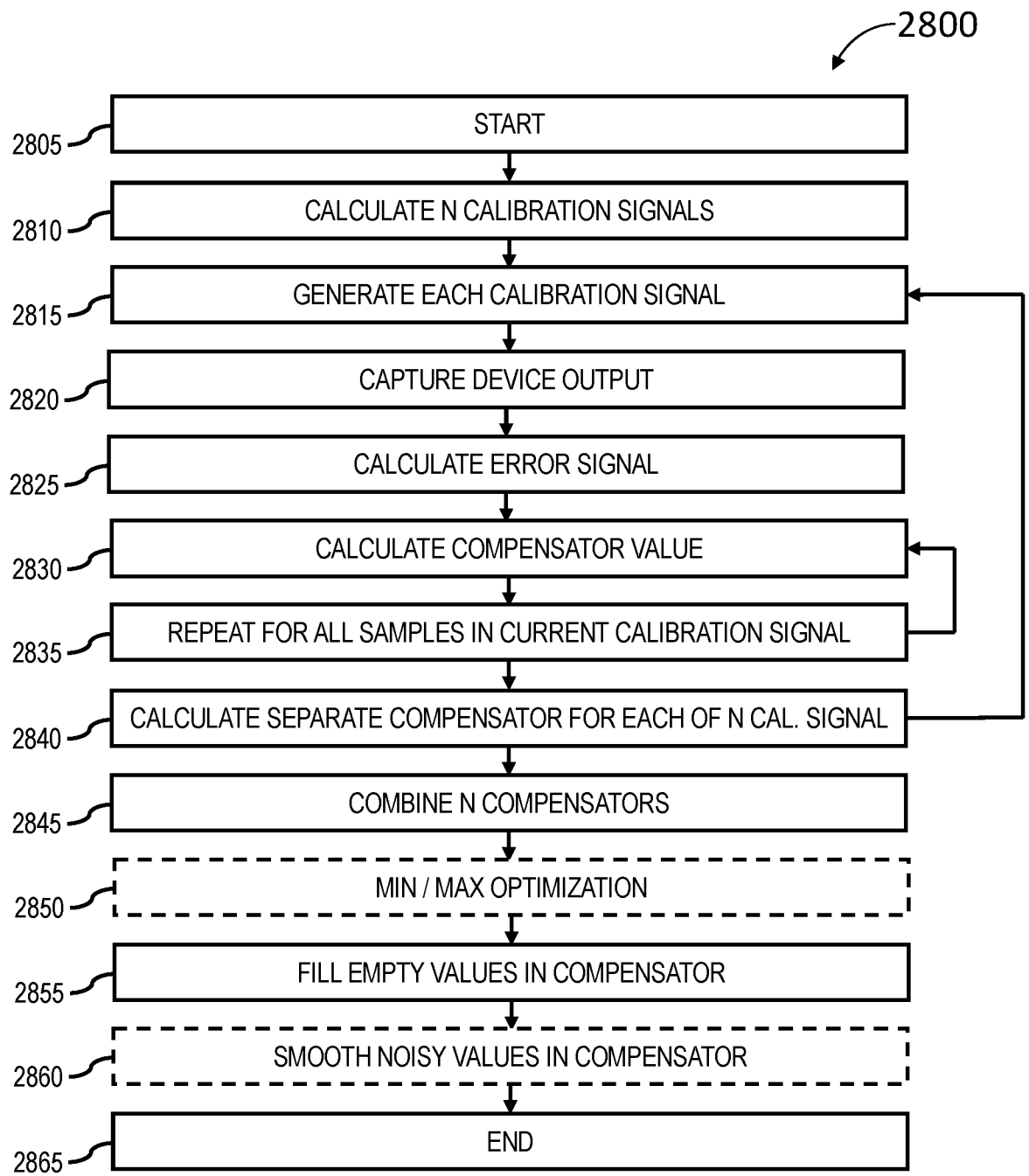
FIG. 28 illustrates a method for non-adaptive calibration of a post-compensated system.

FIG. 28 depicts a flow chart for a method for non-adaptive calibration of the correction parameters 1610 in FIG. 22 for the post-compensation system. At the start 2805 of the calibration process, a set of N calibration signals are calculated 2810. The number N is greater than or equal to one calibration signal. The calibration signal(s) may include one or more single or multi-tone signals spread across the band of interest with varying center frequency, varying spread between the tones, and varying amplitude. The calibration signal(s) may include one or more pseudo-random noise signals. The calibration signal(s) may also include modulated communications or RADAR waveforms for specific applications.

Still referring to FIG. 28, the next step 2815 is to generate each calibration signal. A synthesized signal generator can be used to generate a single-tone signal, or several synthesized signal generators can, by RF combined to generate multi-tone signals. Synthesized signal generators often have undesired harmonic distortion, which can be filtered out with RF low pass filters. Pseudo-random noise signals, modulated signals, or RADAR waveforms can be generated with arbitrary waveform generators (AWGs). Referring to FIG. 22, each calibration signal is applied to the input 1510 of the device 1540.

Referring to both FIG. 22 and FIG. 28, the next step 2820 in the calibration is to capture the output signal 1590 from the device 1540. A buffer of digitized samples of the output signal 1590 is stored in memory. A buffer depth of 8,192 samples is typically sufficient for an accurate calibration.

The next step 2825 is to calculate the error signal. The error signal corresponds to the subtraction of input 1510 of the device 1540 from the output 1590. In many applications, the actual samples of the input signal 1510 are not know but can be estimated from the output signal 1590. One method for estimating the input signal 1510 from the output signal 1590 is to calculate the Fast Fourier Transform (FFT) of the output signal 1590, set all the values of the FFT to be zero for the frequencies not corresponding to the multi-tone input signals, and then perform the inverse FFT to form an estimate of the input signal 1510. This method retains the desired multi-tone signals and removes noise and distortion introduced by the device 1540.

In an alternate embodiment of step 2825, the sub-step of estimating the input signal 1510 from the output signal 1590 includes an extra sub-step of estimating the distortion signal that overlaps the fundamental tones. For device 1540 exhibiting odd-order nonlinear distortion, a portion of the distortion directly overlaps the fundamental desired tones, altering their amplitude and phase. Since this distortion directly overlaps the fundamental signals, this overlapping distortion signal can be difficult to accurately estimate. In one embodiment of the invention, the distortion transfer function is modeled with a third-order nonlinear function $y[n]=a(x[n])^3$ where $y[n]$ distortion signal in output of the device 1540 and $x[n]$ is the input of the device 1540. The unknown value of the variable "a" can be estimated by measuring the levels of the third-order intermodulation distortion components (IMD3). Since the IMD3 components occur at frequencies near (but not overlapping) the fundamental signals, this estimate of "a" is accurate for estimating the overlapping distortion signal. Given the current input $x[n]$ and the estimate of "a", the estimated distortion signal $y[n]$ can be computed. The overlapping distortion signal can be extracted from $y[n]$ by calculating the FFT of $y[n]$, setting all the values of the FFT to be zero for the frequencies not corresponding to the multi-tone input signals, and then performing the inverse FFT to form an estimate of the overlapping distortion signal. This overlapping distortion signal is then added to the previously-estimated input signal 1510 (whose calculation was detailed in the previous paragraph) to form a new, more accurate estimated input signal 1510. The more accurate estimated input signal 1510 is used to calculate a more accurate error signal which is necessary for calculating the compensator value in the next step 2830.

Referring to FIG. 28, the next step 2830 is to calculate the current compensator value. Referring to FIG. 17A, for embodiments of the invention using a memory-based compensator 1650, the current compensator value corresponds to the specific location in the memory 1720 defined by memory indices 1735A-D. The calculation of the memory indices 1735A-D was described previously in reference to FIG. 17A above. The current compensator value corresponding to the current location in memory 1720 is the corresponding error signal value calculated in step 2825.

Referring to both FIG. 22 and FIG. 28, the next step 2835 is to repeat step 2830 for all samples in the current buffer of the output signal 1590. Referring to FIG. 17A, it is possible during this step 2835 that the specific location in memory 1720 defined by memory indices 1735A-D is addressed more than once with differing values of the current compensator value. In that case, in a preferred embodiment of the invention, each of these compensator values is temporarily stored so that they are averaged after all the samples in the current buffer have been processed (i.e., at the completion of step 2835 in FIG. 28). This average value is then stored in the specific location in memory 1720. In an alternative embodiment of the invention, the maximum of each of these compensator values is stored in the specific location in memory 1720.

Referring to both FIG. 28 and FIG. 17A, the next step 2840 is to repeat steps 2815 through 2835 for each of the N calibration signals. Each calibration signal is allocated its own memory 1720 in FIG. 17A, each calibrated in accordance to the steps above. The next step 2845 in FIG. 28 is to combine these N memories 1720 into a single memory 1720 corresponding to the calibrated correction calculator 1650. The N memories can be combined by populating the single memory with the unique entries of the N memories. For any non-unique entries (i.e., "overlapping" entries in the memories 1720), the values in the overlapping memory locations can be averaged. In an alternative embodiment, the maximum of the overlapping memory locations can be used.

Referring to FIG. 28, the next optional step 2850 performs a MINIMAX optimization to minimize the maximum errors, which is described in detail in reference to FIG. 29 below.

Referring to both FIG. 28 and FIG. 17A, the next step 2855 is to fill any remaining empty values in the memory 1720. It is unlikely that all possible memory indices 1735A-D will be exercised, which means that one or more of the entries in the memory 1720 in the correction calculator 1650 shown in FIG. 17A is not been assigned a correction value. Step 2855 in the calibration can used to interpolate the entries in the memory 1720 that have not been assigned a correction value. Many methods for interpolation (also called inpainting) can be used, including nearest neighbor, linear interpolation, polynomial fitting, and piecewise cubic spline, the implementation of which is apparent to one of ordinary skill in the art.

Still referring to both FIG. 28 and FIG. 17A, in one embodiment of the invention, the number of empty values in the memory 1720 can be significantly reduced by a phase rotation method, which can be used an optional additional procedure at the beginning of step 2855 to fill in the empty values. For a multi-tone calibration signal, the distortion transfer function of the device 1540 is usually a function of the amplitude and frequency of the tones but not a function of the phase. However, changing the phase of the tones in the multi-tone calibration signal during the calibration procedure 2800 will exercise different entries in the memory 1720. Since the compensator values in the memory 1720 have already been calculated in step 2830 for each of the multi-tone calibration signals, those values can be used with phase rotations to fill in previously-empty locations in the memory 1720. For each multi-tone calibration signal, the phase of each of the tones can be systematically changed a multitude of times. In one embodiment, the phase is changed randomly with a uniform statistical distribution. In an alternative embodiment, the phase is changed systematically in approximately uniform steps covering all permutations of the phase. The calibration signal is then mathematically generated with the specified phase shifts and using the previously calculated compensator values in the memory 1720 corresponding to the current multi-tone calibration signal calculated in step 2830, that compensator value is repeated in the new memory location exercised by the calibration signal with the phase rotations.

Still referring to both FIG. 28 and FIG. 17A, an optional step 2860 can be performed to smooth noisy values in the memory 1720. It is likely that some of the possible memory indices 1735A-D will be exercised rarely. The more often the entries in the memory 1720 in the correction calculator 1650 shown in FIG. 17A are exercised, the more accurate the correction values 1725 will be because of an averaging effect. A smoothing filter can be applied to the memory 1720 to reduce the noise in the correction values 1725 caused by this effect. For example, a multi-dimensional Gaussian low-pass filter can be convolved with the entries of the memory 1720, the implementation of which is apparent to one of ordinary skill in the art.

Referring to FIG. 28, in one embodiment of the invention, the calibration 2800 can be repeated on a serial combination of two or more multi-dimensional compensators to achieve greater performance. The first multi-dimensional compensator in the serial combination is first calibrated using the calibration 2800 to form the first calibrated multi-dimensional compensator. Then the second multi-dimensional compensator in the serial combination is then calibrated using the calibration 2800. This process can be repeated a multitude of times, improving the performance of the compensation after each stage until the desired performance is achieved.

Figure 29:
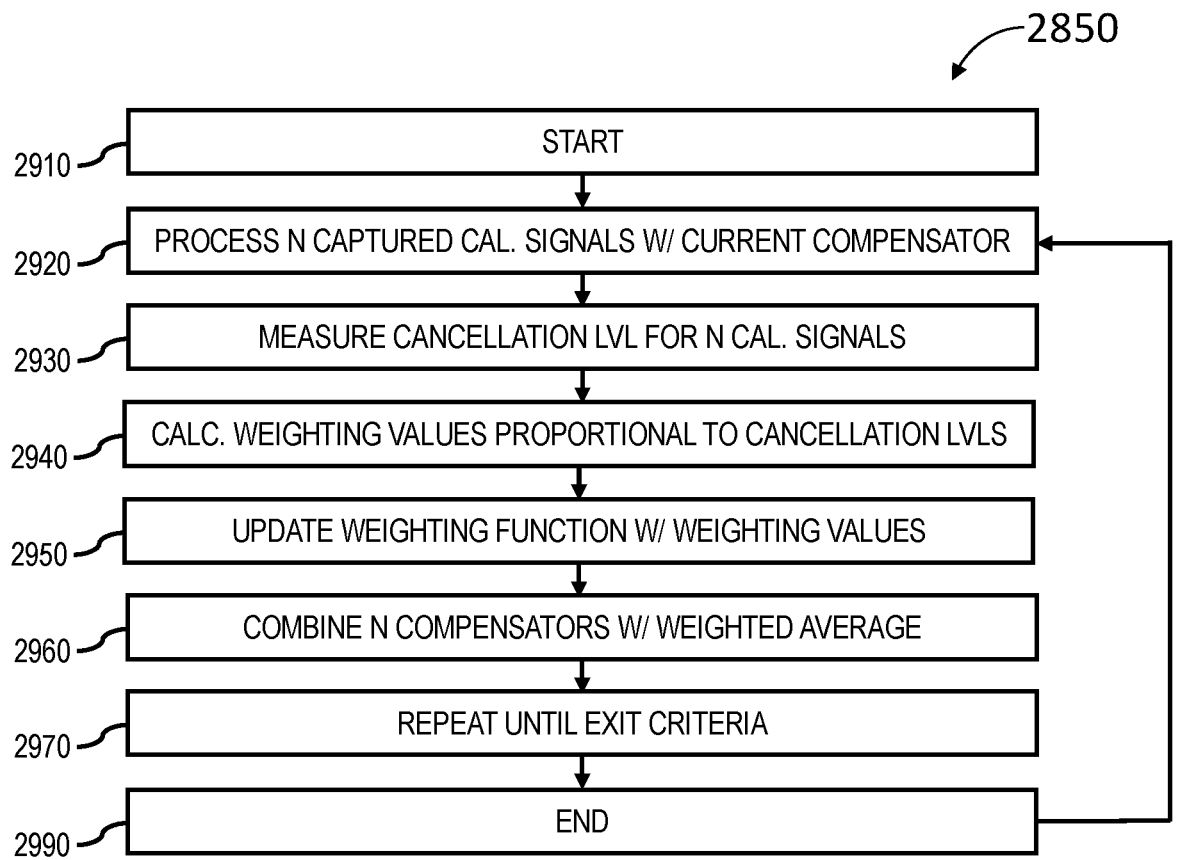
FIG. 29 illustrates a method for MINIMAX optimization of a multi-dimensional compensator.

FIG. 29 depicts a flow chart for the optional step 2850 in the non-adaptive calibration of a post-compensation system 2800 for performing a MINIMAX optimization to minimize the maximum errors. Referring to FIG. 28, the step 2845 generates a single memory 1720 corresponding to the calibrated correction calculator 1650 shown in FIG. 17B. Referring to FIG. 29, the first step 2920 in the MINIMAX optimization 2850 is to process the N signals captured in step 2820 in FIG. 28 using the calibrated correction calculator 1650. The next step 2930 measures the cancellation level for each of these N signals. In a preferred embodiment, the cancellation level corresponds to the largest distortion component in the FFT of each of these N signals. The next step 2940 calculates weighting values that are proportional to the cancellation levels measured in step 2930. In one embodiment, the weighting value is the magnitude of the FFT cell corresponding to the largest distortion component as identified in step 2930. For consistency from one iteration of the algorithm to the next, the set of N weighting values can be divided by the maximum of the N weighting values to normalize the weighting values to a maximum value of one. The next step 2950 updates a weighting function by multiplying the normalized weighting values by the corresponding previous values of the weighting function. On the first iteration, all the values of the weighting function are equal to 1/N, corresponding to equal weighting of all N of the individual memories 1720. On subsequent iterations, once the previous weighting function has been updated by multiplication by the normalized weighting values, the weighting function is normalized such that the sum of the weighting function values equals one. Step 2950 combines the N compensators via a weighted average similar to step 2845 in FIG. 28 as described above. For any non-unique entries (i.e., overlapping entries in the memories 1720), the values in the overlapping memory locations are combined via a weighted average; the memory location for each of the N memories 1720 is multiplied by its corresponding normalized weighting function value and the corresponding values are summed together for all N memories to form the calibrated single memory 1720. The next step 2970 involves repeating steps 2920-2960 until a specific exit criterion is reached. In one embodiment, the exit criterion is a preset number of iterations. In a typical system, the number of iterations equal to 50 is usually sufficient to provide good performance. In an alternate embodiment, the exit criterion is a preset level of the largest measured distortion component; the process 2850 is finished 2990 when the largest distortion component is below this preset level. In another embodiment, the process 2850 is finished 2990 when the N values of the cancellation levels calculated in step 2930 are approximately equal (which is an indication that the MINIMAX optimization is complete).

Figure 30:
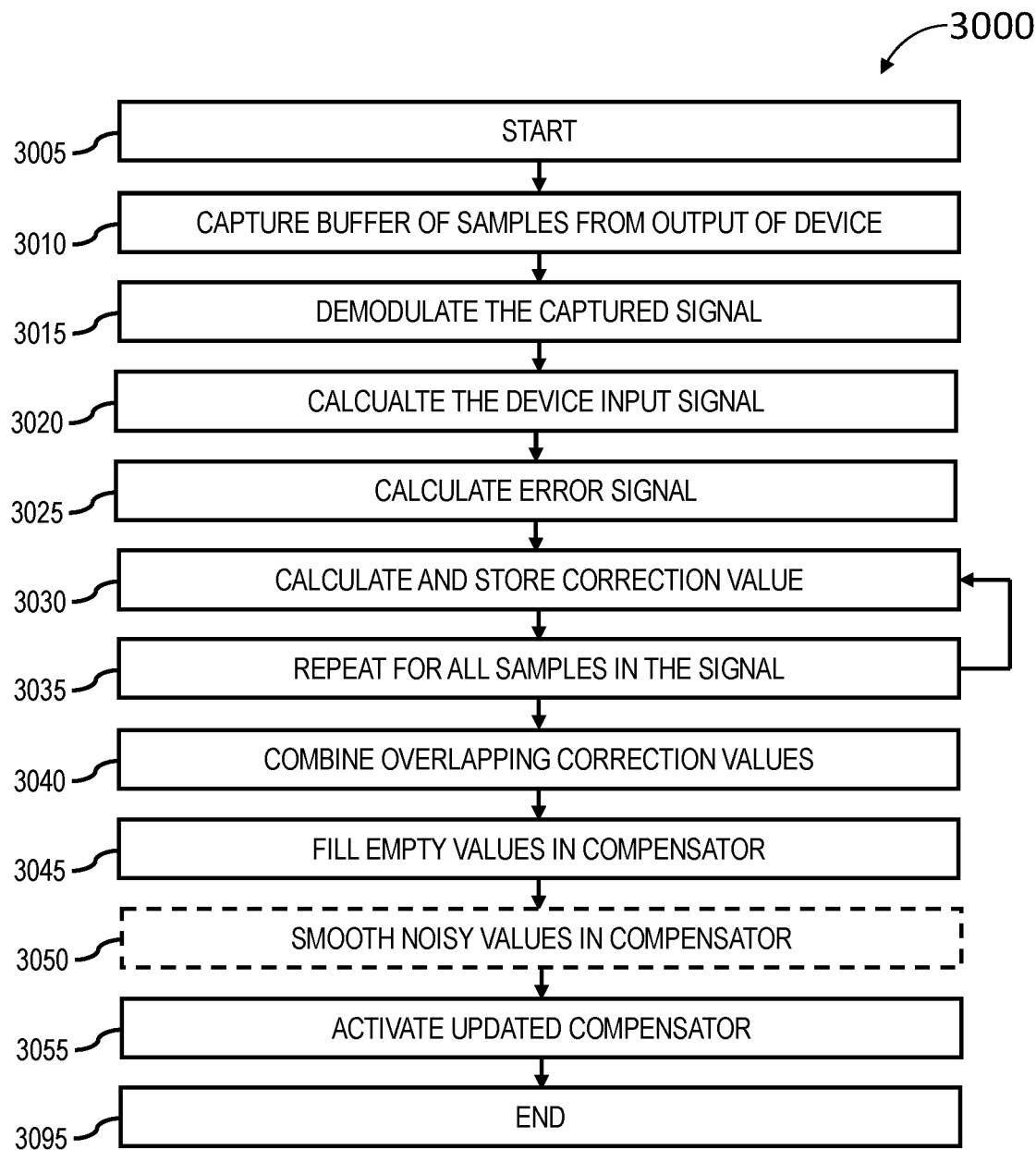
FIG. 30 illustrates a method for adaptive calibration of a post-compensated system.

FIG. 30 depicts a flow chart for a method for adaptive calibration of the correction parameters 1610 in FIG. 22 for the post-compensation system. At the start 3005 of the calibration process, the first step 3010 in the calibration is to capture the output signal 1590 from the device 1540. A buffer of digitized samples of the output signal 1590 is stored in memory. A buffer depth of 8,192 samples is typically sufficient for an accurate calibration.

Referring to FIG. 30, the next step 3015 is to demodulate the signal captured in step 3010. Demodulation requires knowledge of the waveform currently being used in the system, and the appropriate demodulation processing can be applied. For example, if the waveform is 1024-QAM (quadrature amplitude modulation), then a 1024-QAM demodulator can be used to process the signal. Without some knowledge of the type(s) of signals being processed by the system, it may not be possible to deduce the desired input 1510 of the device 1590.

Still referring to both FIG. 22 and FIG. 30, once the signal has been demodulated in step 3015, the demodulated signal is used in step 3020 to calculate the desired input 1510 of the device 1590. The demodulated signal is then modulated using the same modulation scheme, and the modulated signal corresponds to the desired input. This demodulation/modulation step removes noise and distortion caused by the device 1590.

Still referring to both FIG. 22 and FIG. 30, the next step 3025 is to calculate the error signal. The error signal corresponds to the subtraction of input 1510 of the device 1540 from the output 1590.

Referring to FIG. 30, the next step 3030 is to calculate the current compensator value. Referring to FIG. 17A, for embodiments of the invention using a memory-based compensator 1650, the current compensator value corresponds to the specific location in the memory 1720 defined by memory indices 1735A-D. The calculation of the memory indices 1735A-D was described previously in reference to FIG. 17A above. The current compensator value corresponding to the current location in memory 1720 is the corresponding error signal value calculated in step 2825.

Referring to both FIG. 22 and FIG. 30, the next step 3035 is to repeat step 3030 for all samples in the current buffer of the output signal 1590. Referring to FIG. 17A, it is possible during this step 3035 that the specific location in memory 1720 defined by memory indices 1735A-D is addressed more than once with differing values of the current compensator value. Referring to FIG. 30, the next step 3040 is to combine the multiple values. In a preferred embodiment of the invention, each of these compensator values is temporarily stored so that they are averaged after all the samples in the current buffer have been processed (i.e., at the completion of step 3035 in FIG. 30). This average value is then stored in the specific location in memory 1720. In an alternative embodiment of the invention, the maximum of each of these compensator values is stored in the specific location in memory 1720.

Referring to both FIG. 30 and FIG. 17A, the next step 3045 is to fill any remaining empty values in the memory 1720. It is unlikely that all possible memory indices 1735A-D will be exercised, which means that one or more of the entries in the memory 1720 in the correction calculator 1650 shown in FIG. 17A is not been assigned a correction value. Step 3045 in the calibration can used to interpolate the entries in the memory 1720 that have not been assigned a correction value. Many methods for interpolation (also called inpainting) can be used, including nearest neighbor, linear interpolation, polynomial fitting, and piecewise cubic spline, the implementation of which is apparent to one of ordinary skill in the art.

Still referring to both FIG. 30 and FIG. 17A, an optional step 3050 can be performed to smooth noisy values in the memory 1720. It is likely that some of the possible memory indices 1735A-D will be exercised rarely. The more often the entries in the memory 1720 in the correction calculator 1650 shown in FIG. 17A are exercised, the more accurate the correction values 1725 will be because of an averaging effect. A smoothing filter can be applied to the memory 1720 to reduce the noise in the correction values 1725 caused by this effect. For example, a multi-dimensional Gaussian low-pass filter can be convolved with the entries of the memory 1720 (the implementation of which is apparent to one of ordinary skill in the art).

Still referring to both FIG. 30 and FIG. 17A, the final step 3055 activates the updated compensator. The updated memory 1720 can be implemented in a separate memory space from the currently active memory 1720 so that updates do not interfere with the currently active memory 1720. Once the updates have been completed in this adaptive calibration process 3000, the updated memory 1720 can be quickly swapped into the system for a seamless update.

Figure 23:
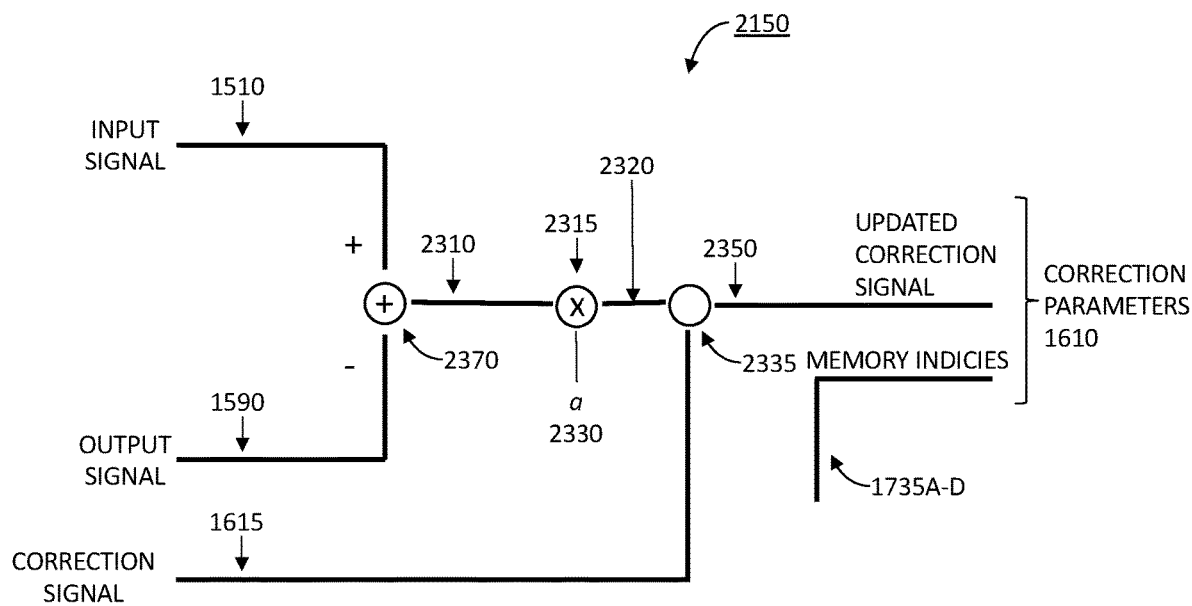
FIG. 23 illustrates adaptive calibration of a multi-dimensional compensator.

FIG. 23 illustrates a preferred embodiment of adaptive calibration 2150 for the pre-compensation configuration shown in FIG. 21. This embodiment allows updates to be calculated in real-time on each clock cycle to track changes that occur very quickly, such as those in fast frequency-hopping systems. Still referring to FIG. 23, an error signal 2310 is formed by subtracting 2370 the system output signal 1510 from the system input signal 1590. The error signal 2310 represents the distortion in the system that is to be cancelled. To insure stability of the algorithm, a convergence factor $\alpha$ 2330 is multiplied 2315 with the error signal 2310 to form the intermediate correction signal 2320. The prior correction signal 1615 and the intermediate correction signal 2320 are combined using the combiner block 2335 to form the updated correction signal 2350. In a preferred embodiment of the invention, the combiner block averages the correction signal 1615 with the intermediate correction signal 2320, which corresponds to a least squares approach. In an alternate embodiment of the invention, the combiner block selects the larger magnitude signal between the prior correction signal 1615 and the intermediate correction signal 2320. This embodiment represents a MINIMAX approach to the distortion cancellation by using the worst case (i.e., largest magnitude) error signals to form the updated correction signal 2350. The adaptive calibration 2150 can be continuously running in the background to track changes in the device 1540, for example, caused by temperature changes, frequency shifts (such as frequency-hopping systems), varying power level, and aging over time.

Referring back to FIG. 17A, the memory indices 1735A-D define which location in memory is currently being accessed to provide the current correction value 1725. Those same memory indices 1735A-D are also used in FIG. 23 to define which memory location is being changed to the updated correction signal 2350. The combination of the memory indices 1735A-D and the updated correction signal 2350 form the correction parameters 1610.

Referring back to FIG. 23, since the correction parameters 1610 depend directly on the error signal 2310, certain parameters of the device 1540 should be measured to provide accurate results and stable performance. These parameters may include the frequency-dependent group delay, $D(f)$, between the device input 1510 and the device output 1590; the frequency-dependent gain, $A(f)$, between the device input 1510 and the device output 1590; or other parameters related to the synchronization of the device.

One method for measuring the frequency-dependent group delay, DO, is with a calibration signal constructed at baseband using a Kaiser Bessel window function to form the calibration template signal, $t[n]$. The calibration template signal, $t[n]$, is then mixed to K frequencies, $f_k$, across the desired bandwidth of the system to form the K group delay calibration signals, $g_k[n]$, each of which are sent to the device input 1510 and then captured from the device output 1590 to form the K received signals, $r_k[n]$. The value of K=10 group delay calibration signals is usually sufficient to characterize the frequency variations in the group delay, $D(f_k)$, across the band. Each of the K received signals, $r_k[n]$, is then match filtered against the corresponding K group delay calibration signals, $g_k[n]$, and the time index, n, of the largest correlation corresponds to the measured group delay, $D(f_k)$, for the corresponding frequency, $f_k$. Match filtering and correlation computations are mathematical techniques apparent to one of ordinary skill in the art. In some cases, noise in the system introduces ambiguities in the measured group delay, $d_k$, corresponding to integer shifts of the period of the sample rate of the system. In those cases, the measured group delays, $D(f_k)$, are first normalized by unwrapping these shifts in the measurements to remove the discontinuities corresponding to the ambiguities in the measured group delay, $D(f_k)$. Unwrapping refers to removing integer shifts of the period of the sample rate of the system.

One method for removing the effect of the group delay is to apply a group delay correction filter, $h_{DELAY}[n]$, to the device output 1590. The group delay correction filter, $h_{DELAY}[n]$, can be designed, for example, with standard FIR filter design techniques (such as a damped Gauss-Newton method) apparent to one of ordinary skill in the art. The desired frequency response of the group delay correction filter, $h_{DELAY}[n]$, would be unity gain with group delay equal to the negative of the measured group delay, $D(f_k)$.

The frequency-dependent gain, $A(f)$, can be measured by applying L single-tone signals with frequency $f_L$ across the desired bandwidth of the system. The value of L=20 single-tone signals is usually sufficient to characterize the frequency variations in the gain, $A(f_L)$, across the band. Each single-tone signal, $a_L[n]$, is sent to the device input 1510 and then captured from the device output 1590 to form the L received signals, $s_L[n]$. One method for calculating the magnitude of the gain, $A(f_L)$, at each of the L frequencies, $f_L$, is by dividing the root-mean-square (RMS) value of each of the received signals, $s_L[n]$, by the RMS value of the corresponding input single-tone signals, $a_L[n]$. Other methods of calculating the gain, such as dividing the FFTs of the signals $s_L[n]$ and $a_L[n]$, would be apparent to one of ordinary skill in the art.

One method for removing the effect of the frequency-dependent gain is to apply a gain correction filter, $h_{GAIN}[n]$ to the device output 1590. The gain correction filter, $h_{GAIN}[n]$, can be designed, for example, with standard FIR filter design techniques (such as the Parks-McClellan method) apparent to one of ordinary skill in the art. The magnitude of the desired frequency response gain correction filter, $h_{GAIN}[n]$, would be equal to the multiplicative inverse of the measured group delay, $A(f_L)$ (i.e., $1/A(f_L)$).

Referring back to FIG. 17B (which illustrates an alternative implementation of the correction calculator 1650 that is based on the evaluation of a function 1730 instead of a memory 1720), the correction parameters 1610 are comprised of the function coefficients. For example, if the function 1730 is implemented as a polynomial equation, then the correction parameters 1610 are the coefficients of the polynomial equation.

Still referring to FIG. 17B, the alternative implementation of the correction calculator 1650 that takes the form of a mathematical function 1730 can also be adaptively calibrated. Now referring to FIG. 23, one method of calibrating the correction parameters 1610 for the function 1730 is to perform the same adaptive calibration 2150 that would be performed on the memory 1720 but with one additional step. First, a memory-based implementation of a correction calculator 1650 shown in FIG. 17A would be implemented and calibrated with the method shown in FIG. 23. The additional step would be to fit a function to the correction values in the memory 1720. In one embodiment, a separate polynomial function can be fit to the correction values in the memory 1720 for each unique derivative signal 1625, 1635, and 1645. This represents a one-dimensional vector of values for which a polynomial equation can be optimally fit in a least-mean squares algorithm (the implementation of which is apparent to one of ordinary skill in the art). Other embodiments may use alternate functions such as spline or finite-impulse response filters.

Referring to FIG. 23, during normal operation, it is unlikely that all possible memory indices 1735A-D will be exercised, which means that one or more of the entries in the memory 1720 in the correction calculator 1650 shown in FIG. 17A is not been assigned a correction value. An additional step in the adaptive calibration 2150 can used to interpolate the entries in the memory 1720 that have not been assigned a correction value. Many methods for interpolation (also called inpainting) can be used, including nearest neighbor, linear interpolation, polynomial fitting, and piecewise cubic spline, the implementation of which is apparent to one of ordinary skill in the art.

Referring to FIG. 23, during normal operation, it is likely that some of the possible memory indices 1735A-D will be exercised rarely. The more often the entries in the memory 1720 in the correction calculator 1650 shown in FIG. 17A are exercised, the more accurate the correction values 1725 will be because of an averaging effect of the adaptive calibration 2150 in FIG. 23. A smoothing filter can be applied to the memory 1720 to reduce the noise in the correction values 1725 caused by this effect. For example, a multi-dimensional Gaussian low-pass filter can be convolved with the entries of the memory 1720 (the implementation of which is apparent to one of ordinary skill in the art).

Figure 31:
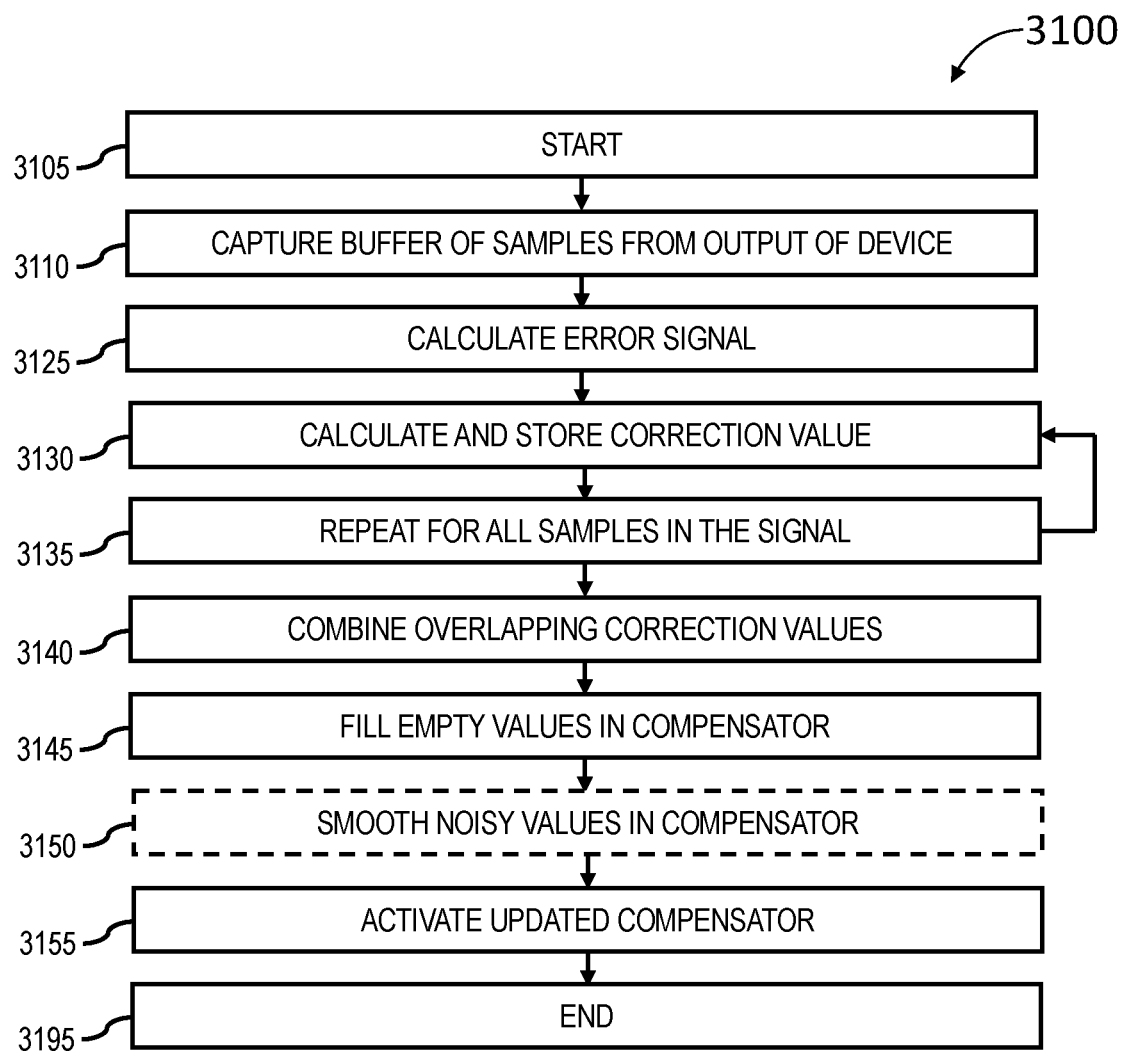
FIG. 31 illustrates a buffer-memory based method for adaptive calibration of a pre-compensated system.

FIG. 31 depicts a flow chart for an alternate method for adaptive calibration of the correction parameters 1610 in FIG. 23 for the pre-compensation system using a buffered memory approach. This allows the updates to be calculated in the background at a slower processing rate and not necessarily be updating the processing at each clock cycle. At the start 3105 of the calibration process, the first step 3110 in the calibration is to capture the output signal 1590 from the device 1540. A buffer of digitized samples of the output signal 1590 is stored in memory. A buffer depth of 8,192 samples is typically sufficient for an accurate calibration.

Referring to both FIG. 22 and FIG. 31, the next step 3125 is to calculate the error signal. The error signal corresponds to the subtraction of input 1510 of the device 1540 from the output 1590.

Referring to FIG. 31, the next step 3130 is to calculate the current compensator value. Referring to FIG. 17A, for embodiments of the invention using a memory-based compensator 1650, the current compensator value corresponds to the specific location in the memory 1720 defined by memory indices 1735A-D. The calculation of the memory indices 1735A-D was described previously in reference to FIG. 17A above. The current compensator value corresponding to the current location in memory 1720 is the corresponding error signal value calculated in step 3125.

Referring to both FIG. 22 and FIG. 31, the next step 3135 is to repeat step 3130 for all samples in the current buffer of the output signal 1590. Referring to FIG. 17A, it is possible during this step 3035 that the specific location in memory 1720 defined by memory indices 1735A-D is addressed more than once with differing values of the current compensator value. Referring to FIG. 31, the next step 3140 is to combine the multiple values. In a preferred embodiment of the invention, each of these compensator values is temporarily stored so that they are averaged after all the samples in the current buffer have been processed (i.e., at the completion of step 3135 in FIG. 31). This average value is then stored in the specific location in memory 1720. In an alternative embodiment of the invention, the maximum of each of these compensator values is stored in the specific location in memory 1720.

Referring to both FIG. 31 and FIG. 17A, the next step 3145 is to fill any remaining empty values in the memory 1720. It is unlikely that all possible memory indices 1735A-D will be exercised, which means that one or more of the entries in the memory 1720 in the correction calculator 1650 shown in FIG. 17A is not been assigned a correction value. Step 3145 in the calibration can used to interpolate the entries in the memory 1720 that have not been assigned a correction value. Many methods for interpolation (also called inpainting) can be used, including nearest neighbor, linear interpolation, polynomial fitting, and piecewise cubic spline, the implementation of which is apparent to one of ordinary skill in the art.

Still referring to both FIG. 31 and FIG. 17A, an optional step 3050 can be performed to smooth noisy values in the memory 1720. It is likely that some of the possible memory indices 1735A-D will be exercised rarely. The more often the entries in the memory 1720 in the correction calculator 1650 shown in FIG. 17A are exercised, the more accurate the correction values 1725 will be because of an averaging effect. A smoothing filter can be applied to the memory 1720 to reduce the noise in the correction values 1725 caused by this effect. For example, a multi-dimensional Gaussian low-pass filter can be convolved with the entries of the memory 1720 (the implementation of which is apparent to one of ordinary skill in the art).

Still referring to both FIG. 31 and FIG. 17A, the final step 3155 activates the updated compensator. The updated memory 1720 can be implemented in a separate memory space from the currently active memory 1720 so that updates do not interfere with the currently active memory 1720. Once the updates have been completed in this adaptive calibration process 3000, the updated memory 1720 can be quickly swapped into the system for a seamless update.

Figure 24:
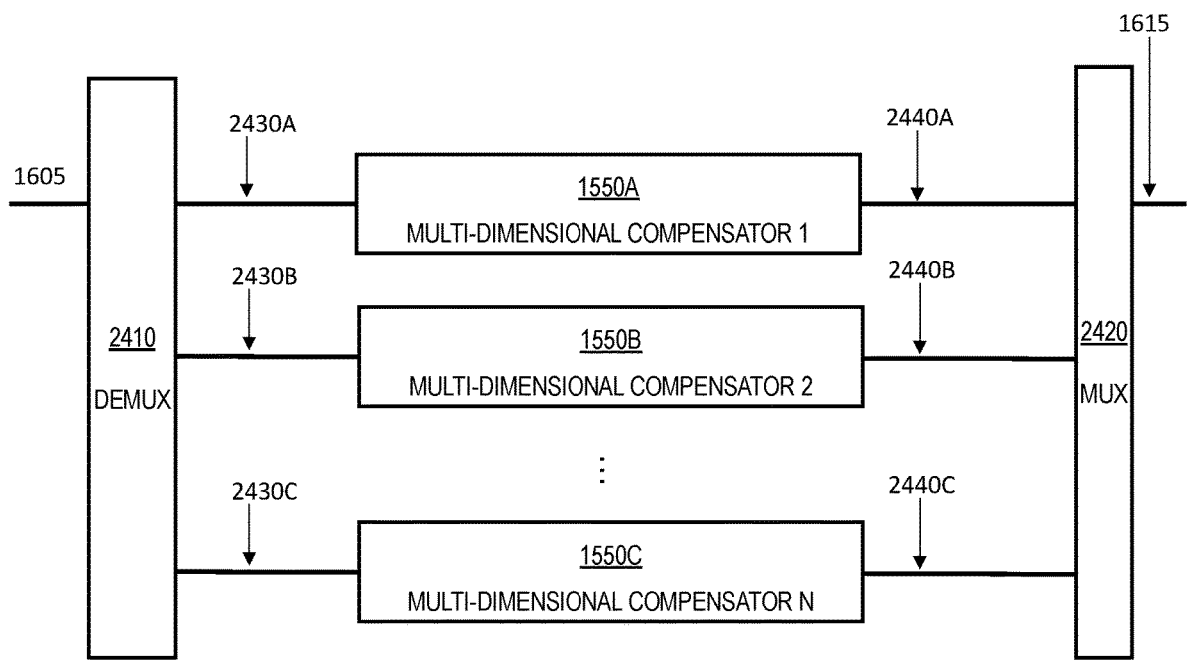
FIG. 24 illustrates a time-division multiplexed multi-dimensional compensator.

FIG. 24 illustrates an embodiment of the invention that uses multiple time-interleaved multi-dimensional compensators 1550A-C. Some devices 1540 are actually multiple time-interleaved sub-devices, each with its own distortion. For example, a wideband analog-to-digital converter can be built using a parallel combination of multiple analog-to-digital converters, each operating on its own time slice. For example, four converters can be used to quadruple the speed of the conversion by clocking the converters 90 degrees out-of-phase. To compensate for the individual distortions that each of these time-interleaved sub-devices exhibit, the compensator input signal 1605 is divided into multiple time-interleaved signals 2430A-C using a demultiplexer 2410. Each time-interleaved signal 2430A-C is allocated its own, corresponding multi-dimensional compensator 1550A-C, whose corresponding outputs 2440A-C are recombined using a multiplexer 2420 to form the correction signal 1615.

Figure 32:
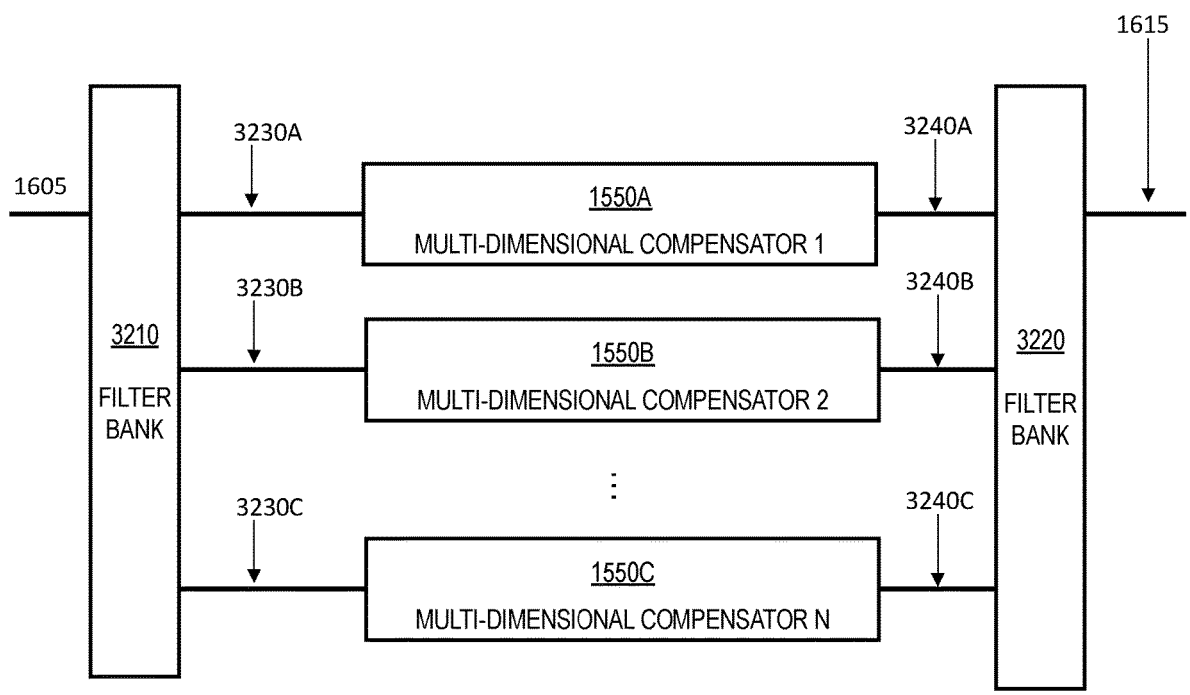
FIG. 32 illustrates a frequency-division multiplexed multi-dimensional compensator.

FIG. 32 illustrates an embodiment of the invention that uses multiple frequency division multiplexed multi-dimensional compensators 1550A-C. Some devices 1540 are implemented with multiple frequency-division multiplexed sub-devices, each with its own distortion. For example, a wideband analog-to-digital converter can be built using a parallel combination of multiple analog-to-digital converters, each operating on its own frequency band. For example, four converters can be used to quadruple the speed of the conversion by allocating one-fourth of the band to each converter. To compensate for the individual distortions that each of these frequency-division multiplexed sub-devices exhibit, the compensator input signal 1605 is divided into multiple frequency-division multiplexed signals 3230A-C using a filter bank 3210. Each frequency-division multiplexed signal 3230A-C is allocated its own, corresponding multi-dimensional compensator 1550A-C, whose corresponding outputs 3240A-C are recombined using a filter bank 3220 to form the correction signal 1615.

Figure 25:
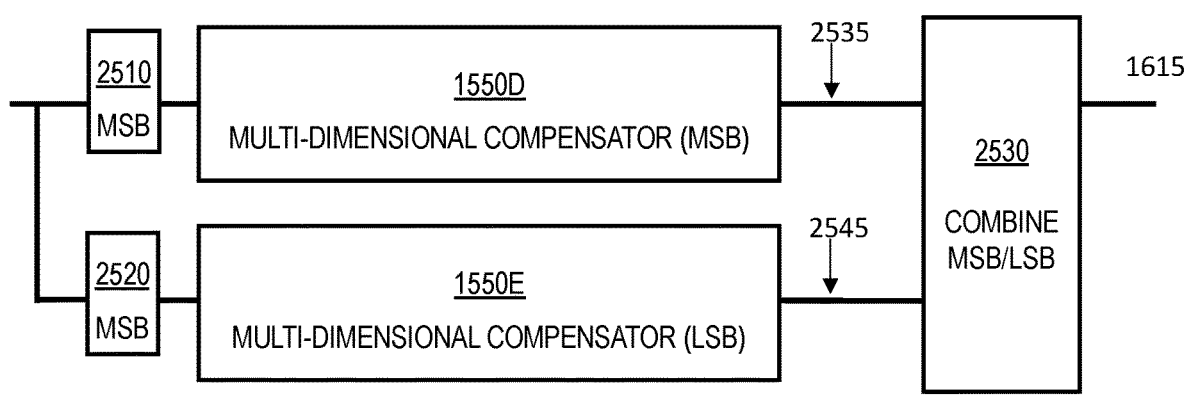
FIG. 25 illustrates a sub-ranged multi-dimensional compensator.

FIG. 25 illustrates an embodiment of the invention that uses multiple multi-dimensional compensators 1550D-E for different amplitude ranges. Some devices 1540 are multiple sub-devices for different amplitude range, each with its own distortion. For example, a high-resolution analog-to-digital converter can be built using multiple sub-ranged analog-to-digital converters, each operating on its own amplitude range. To compensate for the individual distortions that each of these sub-devices exhibit, the compensator input signal 1605 is divided into multiple signals corresponding to different amplitude ranges. The compensator input signal 1605 is divided into its most significant bits with the MSB block 2510 to form the MSB signal 2515 and its least significant bits with the LSB bock 2520 to form the LSB signal 2525. One implementation of the MSB block 2510 is a right bit shifter to truncate the input signal 1605 to its most-significant bits. Similarly, one implementation of the LSB block 2520 is a left bit shifter to truncate the input signal 1605 to its least significant bits. The MSB signal 2515 and the LSB signal 2525 are allocated their own, corresponding multi-dimensional compensator 1550D and 1550E respectively, whose corresponding outputs 2535 and 2545 are recombined using a combiner 2530 to form the correction signal 1615. The combiner 2530 can be implemented by left shifting the MSB compensator signal 2535 and adding it to the LSB compensator signal 2545.

Figure 26:
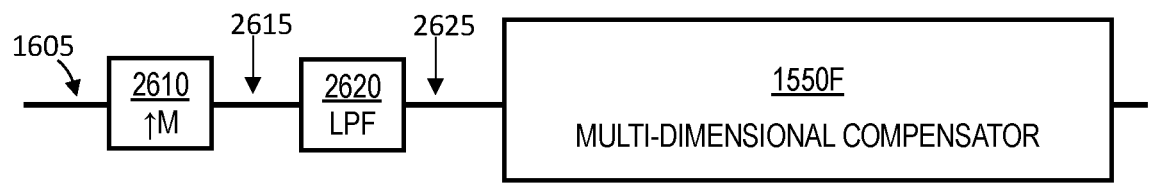
FIG. 26 illustrates an interpolated multi-dimensional compensator.

FIG. 26 illustrates an embodiment of the invention that uses interpolation to increase the resolvable bandwidth of the system. If a device 1540 exhibits $M^{th}$ order nonlinear distortion, the distortion components will span M times the bandwidth (BW) of the original signal. For a critically-sampled system where the sample rate satisfies the Nyquist criterion where the sampling rate Fs is equal to twice the bandwidth (BW), then some of the nonlinear distortion will alias in-band and be indistinguishable from distortion components at a lower frequency. To properly resolve these distortion components, the compensator input signal 1605 can be interpolated by a factor of M to eliminate the possibility of aliasing. Interpolation can be implemented by upsampling 2610 by a factor of M to form the upsampled signal 2615 followed by low-pass filtering 2620 to form the interpolated signal 2625. The interpolated signal 2625 feeds the multi-dimensional compensator 1550F, which is able to properly handle the higher frequency distortion components that would otherwise have been aliased.

Figure 27:
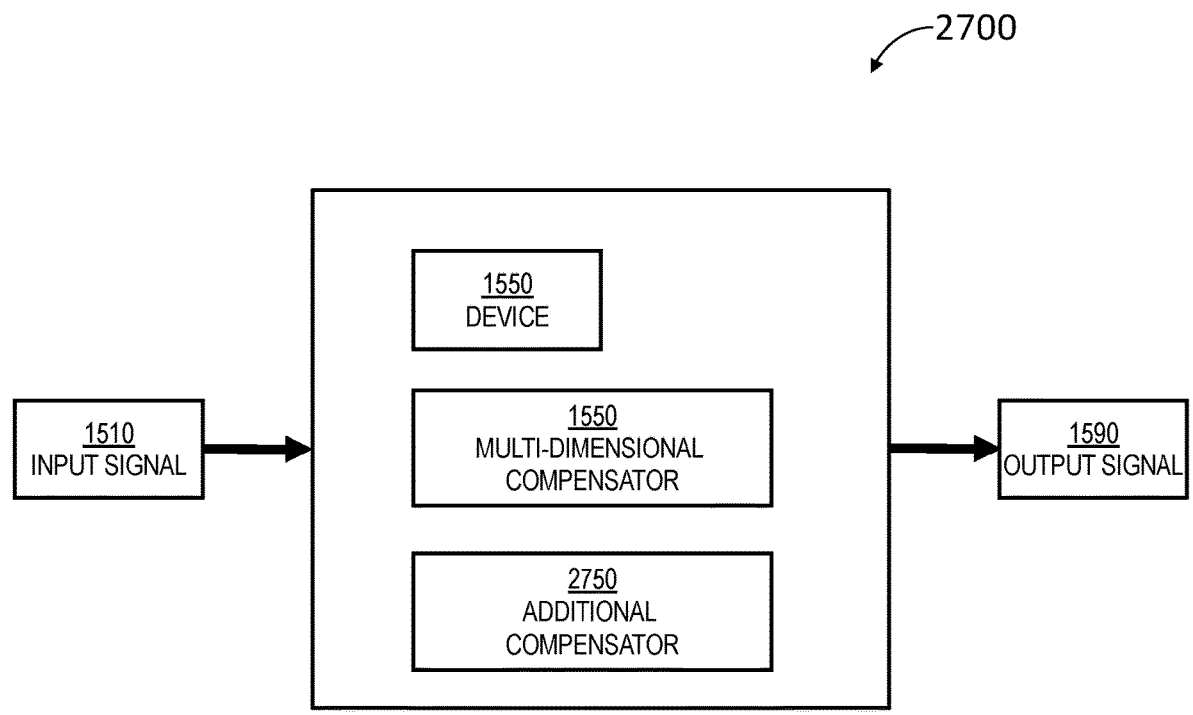
FIG. 27 illustrates a compensated system with a multi-dimensional compensator with an additional compensator.

FIG. 27 illustrates a multi-dimensional compensation system 2700 of a device 1540 exhibiting distortion that includes a multi-dimensional compensator 1550 and an additional compensator 2750. The multi-dimensional compensator 1550 is a computationally-efficient approach to cancelling distortion, but some applications may require even higher levels of performance. In those cases, an additional compensator 2750 can be used to provide the extra performance. In one embodiment of the invention, the additional compensator can be a Volterra nonlinear filter for accurately modeling nonlinear distortion over frequency. A benefit for combining the Volterra filter implementation of the additional compensator 2750 with a multi-dimensional compensator 1550 is that the multi-dimensional compensator 1550 can significantly reduce the complexity, size, weight, power, and cost of the Volterra processing compared to using a Volterra processing approach alone.

Figure 19:
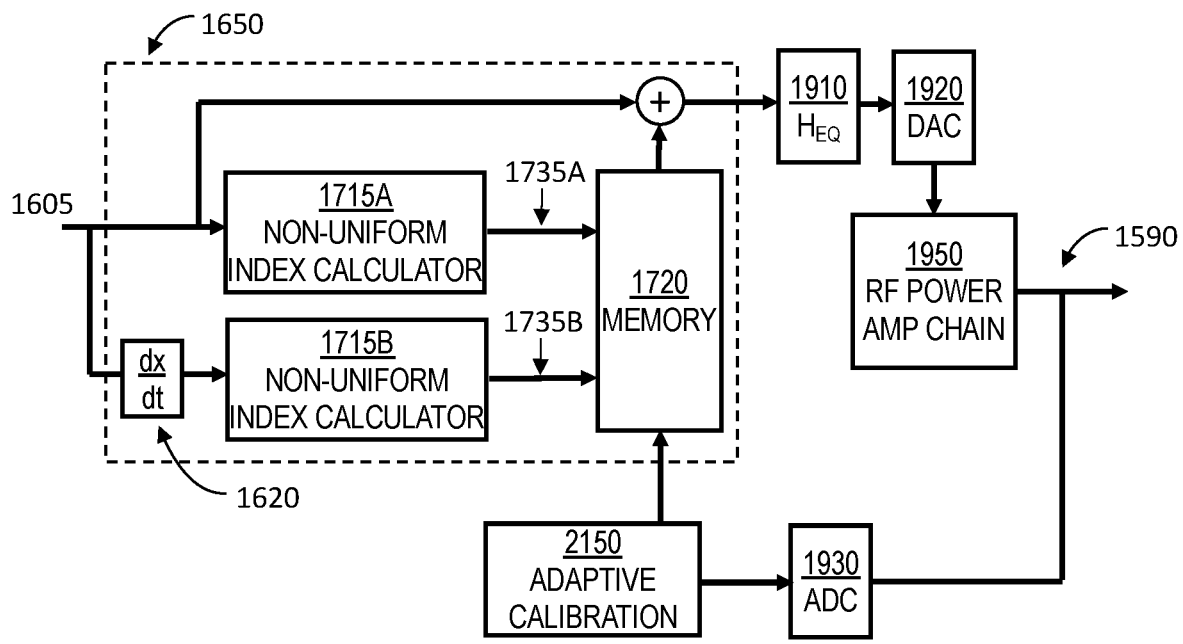
FIG. 19 illustrates a multi-dimensional compensator applied to an RF power amplifier application.

FIG. 19 depicts an embodiment of the multi-dimensional compensator for a pre-distortion compensation of an RF power amplifier. The multi-dimensional compensator 1650 uses two functional inputs, the first of which is present signal input 1605 and the second is the first derivative function 1620. The index calculator 1715A operates on the present signal input 1605 and corresponds to a non-uniform indexing configuration. The input 1605 is quantized to 12-bit resolution corresponding to 4096 different possible states. In the index calculator 1715A, the range of present signal input 1605 levels from −511 to +512 is allocated 1024 uniformly-distributed values. The range of present signal input 1605 levels from −2048 to −512 is allocated 512 uniformly-distributed values. Similarly, the range of present signal input 1605 levels from +2048 to +512 is also allocated 512 uniformly-distributed values. This allocation reduces the size of the memory 1720 by 50% since the 4096 possible states of the present signal input 1605 is allocated a total of 2048 locations in the memory 1720.

Still referring to FIG. 19, the output of the first derivative function 1620 is normalized to have values between −2 and +2 and quantized by the index calculator 1715B into 32 non-uniformly distributed values. The range of values from −0.5 to +0.5 is allocated 24 uniformly-distributed values. The range of values from +2 to +0.5 is allocated 4 uniformly-distributed values. Similarly, the range of values from −2 to −0.5 is also allocated 4 uniformly-distributed values. Statistically, signals are more likely to have first derivative values near zero, so more quantization resolution (i.e., more quantized values) are allocated for small values (i.e., −0.5 to +0.5).

Still referring to FIG. 19, the nominal size of the memory 1720 is equal to 2048 present signal input values times 32 values of the derivative, which equals 65,536 memory locations (i.e., 64K) each with 16 bits of resolution. The nominal data rate of this system is 2560 MHz which exceed the clock speed limitations of current field programmable gate arrays (FPGAs), so the processing is implemented in a parallel fashion by demultiplexing the data by a factor of 8, which corresponds to a data rate of 320 MHz. Therefore, the 64K memory 1720 is implemented in eight 64K demultiplexed memories each operating at 320 MHz.

Still referring to FIG. 19, the first differentiator function 1620 is implemented in an interpolated first difference architecture shown in FIG. 18C where the interpolation rate M in the interpolator 1880 is equal to 4.

Still referring to FIG. 19, the output of the multi-dimensional compensator 1650 optionally feeds a correction filter $H_{EQ}$ 1910 that can be used to adjust the amplitude and/or phase of the signal to compensate for frequency-dependent variations. The filter 1910 is implemented as a 16-tap FIR filter. The output of the filter 1910 feeds a digital-to-analog converter (DAC) 1920 with 12-bit resolution sampling at 2560 MHz clock rate. The DAC 1920 converts digital inputs to analog outputs. The output of the DAC 1920 then feeds the RF power amplifier signal chain 1950, which includes low pass filters (to remove high-frequency images of the signal induced by the DAC, a driver pre-amplifier, a high-power GaN RF power amplifier, and an RF load (such as an attenuator). The output of the RF power amplifier signal chain 1950 is also fed to an analog-to-digital converter (ADC) 1920 with 12-bit resolution sampling at 2560 MHz clock rate. The frequency band of operation for this system is 100 MHz to 1000 MHz. The output of the ADC 1930 feeds the adaptive calibration block 2150.

Still referring FIG. 19, the adaptive calibration block 2150 is implemented in the buffer-based adaptive calibration 3100 shown in FIG. 31 and described previously. The number of samples in the buffer uses in step 3110 is equal to 3,840 samples. In step 3125, the error signal is calculated using the output of the ADC 1930, which corresponds to the RF power amplifier output.

Figure 20:
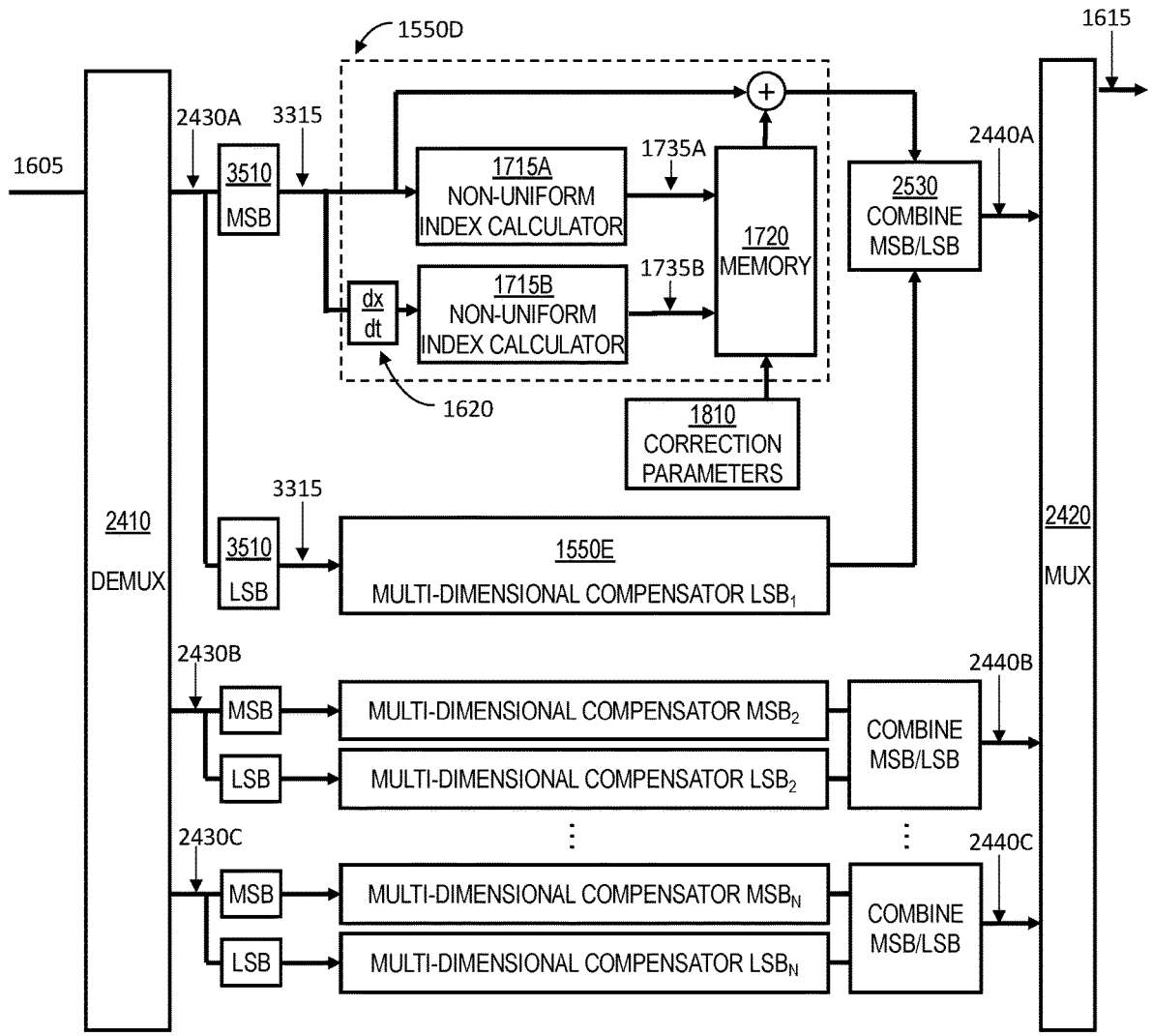
FIG. 20 illustrates a multi-dimensional compensator applied to wideband analog-to-digital and digital-to-analog conversion

FIG. 20 depicts an embodiment of the multi-dimensional compensator for either post-compensation of a time-interleaved analog-to-digital converter (ADC) or pre-compensation of a time-interleaved digital-to-analog converter (DAC) implemented in an application-specific integrated circuit (ASIC). The compensator is implemented as a parallel array of demultiplexed multi-dimensional compensators as described previously in reference to FIG. 24. A time-interleaved ADC or DAC is comprised of a parallel array of M individual converters, where each individual converter is operating on its own time slice at 1/M of the system data rate. Demultiplexing the data by a factor of M allocates a separate multi-dimensional compensator for each individual converter.

Referring back to FIG. 20, the compensator input signal 1605 is processed with the demultiplexer 2410 to form 64 parallel signals 2430A-C (each at $\frac{1}{64}^{th}$ the data rate of the input 1605). The input signal 1605 is quantized to 8-bit resolution and is running at data rates ranging from 32 GHz to 64 GHz. Each output 2440A-C is multiplexed 2420 back together to form the compensator input output signal 1615. For post-compensation of a time-interleaved ADC, the ADC output feeds the compensator input signal 1605, and the compensator output signal 1615 corresponds to the compensated ADC signal. For pre-compensation of a time-interleaved DAC, the compensator input signal 1605 corresponds to the system input, and the compensator output signal 1615 corresponds to the pre-compensated signal which feeds the DAC input such that the output of the DAC is compensated.

Each of the parallel demultiplexed signals 2430A-C is further sub-divided into two sub-ranged multi-dimensional compensators as described previously in reference to FIG. 25. Each time-interleaved ADC is an 8-bit sub-ranged architecture, where a separate internal 4-bit ADC is used to quantize the most-significant bits (MSBs) corresponding to a coarse quantization of the input signal; similarly, a separate internal 4-bit ADC is used to quantize the least-significant bits (LSBs) corresponding to a fine quantization of the input signal. The MSB ADC and the LSB ADC may have different distortion mechanisms, so separate multi-dimensional compensators 1550D and 1550E are allocated to the MSBs and the LSBs respectively. The sub-ranged multi-dimensional compensators 1550D and 1550E output signals 2535 and 2345 respectively, which are combined with the MSB/LSB combiner 2430 as previously described in reference to FIG. 25. This architecture is similarly repeated to form output signals 2440B-C. The signals 2440B-C are multiplexed 2420 back together as described in the previous paragraph.

Referring to FIG. 20, the sub-ranged MSB multi-dimensional compensator includes the present value function for the first input signal 2515 and the first derivative function 1620 for the second input signal. The index calculator 1715A applies a non-uniform quantization on the 16 states of the 4-bit present value signal 2515. The index calculator 1715B applies a non-uniform quantization on the output of the first derivative function 1620, providing 32 quantization states. The resulting size of the memory 1720 is 512 entries, each with 8 bits of resolution. The sub-ranged LSB multi-dimensional compensator 1550E is implemented analogously to compensator 1550D. The correction parameters 1610 are calculated in the calibration routine 2800 as described previously in reference to FIG. 28.

The techniques described above can be implemented via software in certain implementations. For example, the techniques described above are applied to an audio subwoofer signal using software executed on a digital signal processor (DSP chip). Audio signals are much, much lower bandwidth than radio frequency signals, and thus it is practical to implement the multi-dimensional compensator in software for audio applications.

The present invention is applicable to a wide range of military and commercial applications including, but not limited to: advanced radar systems; software-defined radios; multi-beam adaptive digital beamforming array transceivers, smart radios for wireless communications (terrestrial and satellite); wideband electronic warfare transceivers; general test equipment such as oscilloscopes, spectrum analyzers, and network analyzers; special test equipment, wide bandwidth modems, anti jam global positioning system (GPS) receivers, and active radar for Earth science measurements.

While the present invention has been described for a predistortion linearization application (such as linearization of RF transmit electronics including RF power amplifiers or digital-to-analog converters), it will be readily apparent to one of ordinary skill in the art that the same principles can be applied to a post-distortion linearization application (such as linearization of RF receive electronics, including low noise amplifiers or analog-to-digital converters).

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

We claim:

1. A multi-dimensional compensator comprising:
   a correction calculator having a plurality of multi-dimensional inputs and an output, wherein one of the multi-dimensional inputs is coupled to an input signal, the correction calculator further comprising correction parameters; and
   a first circuit applying a first function to the input signal to create a first function signal, wherein the first function signal is coupled to a second one of the multi-dimensional inputs of the correction calculator;
   wherein the output of the correction calculator produces a correction signal compensating for distortion introduced by an electronic component;
   wherein the correction signal is added to an output of the electronic component; and
   wherein the correction parameters are calculated from one or more single-tone and multi-tone signals injected into the electronic component.

2. The multi-dimensional compensator of claim 1, wherein the first function is selected from the group of: delay function, a derivative, a derivative of order N where N is greater than one, an integral, an integral of order M where M is greater than one, a signal statistic, covariance, a power calculation function, a polynomial, and a combination thereof.

3. The multi-dimensional compensator of claim 1, wherein the correction parameters are predetermined according to a one-time calibration of the electronic component.

4. The multi-dimensional compensator of claim 1, wherein the correction parameters are updated periodically according to an adaptive calibration of the electronic component.

5. The multi-dimensional compensator of claim 1, wherein the correction calculator is implemented in memory.

6. The multi-dimensional compensator of claim 1, wherein the input signal and first function signal are quantized values.

7. The multi-dimensional compensator of claim 6, wherein the quantized values are created according to non-uniform quantization.

8. The multi-dimensional compensator of claim 1, wherein the correction calculator calculates a correction value using a calculator function selected from the group consisting of an equation, a spline, a finite-impulse response filter, and a combination thereof.

9. The multi-dimensional compensator of claim 1, wherein the first circuit comprises a finite-impulse response filter, or an average of a forward first difference and a backward first difference, or an interpolator and an average of a forward first difference and a backward first difference.

10. The multi-dimensional compensator of claim 1, wherein the input signal comprises complex numbers.

11. The multi-dimensional compensator of claim 1, wherein the correction signal is fed into an input of the electronic component.

12. The multi-dimensional compensator of claim 1, wherein the correction parameters account for frequency-dependent group delay introduced by the electronic component.

13. The multi-dimensional compensator of claim 1, wherein the correction parameters are calculated using MINIMAX optimization.

14. The multi-dimensional compensator of claim 11, wherein the correction parameters are calculated using a buffer of digitized samples of an output signal of the electronic component.

15. The multi-dimensional compensator of claim 1, wherein the correction parameters are calculated based on a predetermined modulation type.

16. The multi-dimensional compensator of claim 1, wherein the input signal comprises a time-interleaved signal.

17. The multi-dimensional compensator of claim 1, wherein the input signal comprises a frequency-division multiplexed signal.

18. The multi-dimensional compensator of claim 1, wherein the input signal comprises a most significant bit (MSB) signal.

19. The multi-dimensional compensator of claim 1, wherein the input signal comprises a least significant bit (LSB) signal.

20. The multi-dimensional compensator of claim 1, wherein the input signal comprises an interpolated signal.

21. A multi-dimensional compensation system comprising:
   the multi-dimensional compensator of claim 1, and
   a Volterra nonlinear filter.

22. The multi-dimensional compensator of claim 1 further comprising:
   a second circuit applying a second function to the input signal to create a second function signal, wherein the second function signal is coupled to a third one of the multi-dimensional inputs of the correction calculator, wherein the first function and the second function are different.

23. A multi-dimensional compensator comprising:
a demultiplexer processing an input signal into N parallel demultiplexed signals each at 1/Nth a data rate of the input signal, wherein N is an integer equal to or greater than two;
a first analog-to-digital converter (ADC) processing each one of the N parallel demultiplexed signals into a most significant bit (MSB) signal;
a second ADC processing each one of the N parallel demultiplexed signals into a least significant bit (LSB) signal;
for each MSB signal, a sub-ranged multi-dimensional compensator processing the respective MSB signal into a first output signal;
for each LSB signal, a sub-ranged multi-dimensional compensator processing the respective LSB signal into a second output signal;
for each first output signal and second output signal, a MSB/LSB combiner combining the respective first output signal and respective second output signal into a third output signal; and
a multiplexer processing the respective third output signal into a compensator output signal.

24. The multi-dimensional compensator of claim 23, wherein the sub-ranged multi-dimensional compensator comprises a differentiator, a first index calculator, a second index calculator, and memory.

25. A multi-dimensional compensator comprising:
a correction calculator having a plurality of multi-dimensional inputs and an output, wherein one of the multi-dimensional inputs is coupled to an input signal, the correction calculator further comprising correction parameters; and
a first circuit applying a first function to the input signal to create a first function signal, wherein the first function signal is coupled to a second one of the multi-dimensional inputs of the correction calculator;
wherein the output of the correction calculator produces a correction signal compensating for distortion introduced by an electronic component; and
wherein the input signal comprises a most significant bit (MSB) signal or a least significant bit (LSB) signal.

* * * * *